United States Patent
Nagashima

(10) Patent No.: US 10,416,228 B2
(45) Date of Patent: Sep. 17, 2019

(54) PROBER

(71) Applicant: Tokyo Seimitsu Co., Ltd., Tokyo (JP)

(72) Inventor: Hideaki Nagashima, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 15/874,847

(22) Filed: Jan. 18, 2018

(65) Prior Publication Data
US 2018/0252765 A1 Sep. 6, 2018

Related U.S. Application Data

(63) Continuation of application No. PCT/JP2016/070170, filed on Jul. 7, 2016.

(30) Foreign Application Priority Data

| Jul. 23, 2015 | (JP) | 2015-145988 |
| Jan. 8, 2016 | (JP) | 2016-002739 |
| Mar. 29, 2016 | (JP) | 2016-066461 |

(51) Int. Cl.
*G01R 31/28* (2006.01)
*G01R 1/073* (2006.01)

(52) U.S. Cl.
CPC ..... *G01R 31/2887* (2013.01); *G01R 1/07307* (2013.01); *G01R 1/07314* (2013.01)

(58) Field of Classification Search
CPC .......................... G01R 31/2887; G01R 1/07314
(Continued)

(56) References Cited

U.S. PATENT DOCUMENTS 5,404,111 A * 4/1995 Mori .................. G01R 1/07314
324/750.23
5,777,485 A 7/1998 Tanaka et al.
(Continued)

FOREIGN PATENT DOCUMENTS

JP H11-145221 A 5/1999
JP 2003-287552 A 10/2003
(Continued)

OTHER PUBLICATIONS

Tokyo Seimitsu Co, Ltd., Correct translation of International Preliminary Report on Patentability, PCTJP2016070170 dated Oct. 19, 2017, 6 pgs., previously submitted on Jan. 18, 2018.
(Continued)

*Primary Examiner* — Jermele M Hollington
(74) *Attorney, Agent, or Firm* — Morgan, Lewis & Bockius LLP

(57) ABSTRACT

To provide a prober and a probe contact method capable of enhancing the reliability of electrical contact between electrode pads on a wafer and probes. A prober includes a wafer chuck, a probe card, a ring-shaped seal member provided on the wafer chuck, a Z-axis moving/rotating unit which lifts up and down the wafer chuck detachably fixed to a wafer chuck fixing part, a decompressor which depressurize an internal space formed by the probe card, the wafer chuck and the ring-shaped seal member, a lifting controller which controls the Z-axis moving/rotating unit to bring probes into contact with electrode pads in an overdrive condition, and a depressurization controller which controls the decompressor such that the wafer chuck is drawn to the probe card by depressurization of the internal space.

7 Claims, 14 Drawing Sheets

(58) Field of Classification Search
USPC .................................................. 324/754.11
See application file for complete search history.

(56) References Cited

U.S. PATENT DOCUMENTS

| | | | | |
|---|---|---|---|---|
| 5,999,268 | A * | 12/1999 | Yonezawa | G01R 31/2887 |
| | | | | 324/750.19 |
| 6,634,245 | B1 * | 10/2003 | Yoshioka | G01R 31/2887 |
| | | | | 324/750.2 |
| 2002/0011854 | A1 * | 1/2002 | Kuji | G01R 31/2851 |
| | | | | 324/750.19 |
| 2009/0015282 | A1 | 1/2009 | Steps et al. | |
| 2011/0316571 | A1 | 12/2011 | Kiyokawa et al. | |
| 2013/0241587 | A1 * | 9/2013 | Chua | G01R 1/04 |
| | | | | 324/750.23 |
| 2015/0219687 | A1 | 8/2015 | Furuya et al. | |
| 2015/0260788 | A1 * | 9/2015 | Yamada | G01R 31/2893 |
| | | | | 324/750.25 |

FOREIGN PATENT DOCUMENTS

| | | |
|---|---|---|
| JP | 2010-186998 A | 8/2010 |
| JP | 2012-242299 A | 12/2012 |
| JP | 2013-219299 A | 10/2013 |
| JP | 2014-029917 A | 2/2014 |
| JP | 2015-073119 A | 4/2015 |
| JP | 2015-106626 A | 6/2015 |

OTHER PUBLICATIONS

Tokyo Seimitsu Co. Ltd., International Preliminary Report on Patentability, PCTJP2016070170, Oct. 19, 2017, 12 pgs.

* cited by examiner

PROBER

CROSS-REFERENCE TO RELATED APPLICATIONS

This application is a Continuation of PCT International Application No. PCT/JP2016/070170 filed on Jul. 7, 2016, which claims priorities under 35 U.S.C. § 119(a) to Japanese Patent Application No. 2015-145988 filed on Jul. 23, 2015, Japanese Patent Application No. 2016-002739 filed on Jan. 8, 2016 and Japanese Patent Application No. 2016-066461 filed on Mar. 29, 2016. Each of the above application(s) is hereby expressly incorporated by reference, in its entirety, into the present application.

BACKGROUND OF THE INVENTION

Field of the Invention

The present invention relates to a prober and a probe contact method for bringing electrode pads on a wafer held by a wafer chuck into contact with probes provided on a probe card.

Description of the Related Art

Conventionally, there is known a probe contact method including: lifting a wafer chuck up by a lifting mechanism until a seal member provided on the wafer chuck comes into contact with a probe card to form an internal space (sealed space) surrounded by the wafer chuck, the probe card, and the seal member; and thereafter depressurizing the internal space by depressurization means (vacuum pump) to draw the wafer chuck toward the probe card and bring electrode pads on a wafer (semiconductor wafer) held by the wafer chuck into contact with probes provided on the probe card (for example, refer to PTL 1).

Additionally, conventionally, when electrode pads on a wafer and probes are brought into contact with each other, it is demanded that an oxide film as an insulator formed on the electrode pads on the wafer is removed so as to bring new metal surfaces into contact with each other, from a viewpoint of the reliability of electrical contact (for example, refer to PTL 2).

CITATION LIST

Patent Literature

PTL 1: Japanese Patent Application Laid-Open No. 2010-186998
PTL 2: Japanese Patent Application Laid-Open No. 2003-287552

SUMMARY OF THE INVENTION

However, in the probe contact method described in PTL 1, the electrode pads on the wafer and the probes do not come into contact with each other by lift up operation of the wafer chuck by the lifting mechanism, and but come into contact with each other by subsequent drawing operation of the wafer chuck by the depressurization means for the first time, and the drawing speed of the wafer chuck by the depressurization means is slower than the lift up speed of the wafer chuck by the lifting mechanism. Therefore, in the probe contact method described in PTL 1, the oxide films as insulators formed on the electrode pads on the wafer cannot be removed even when the electrode pads on the wafer and the probes come into contact with each other by the drawing operation of the wafer chuck by the depressurization means, and it is difficult to enhance the reliability of electrical contact between the electrode pads on the wafer and the probes.

The present invention has been made in view of such a circumference, and aims to provide a prober and a probe contact method capable of enhancing the reliability of electrical contact between electrode pads on a wafer and probes.

In order to achieve the above object, a prober according to an aspect of the present invention includes: a wafer chuck configured to hold a wafer; a probe card provided facing the wafer chuck, and including probes at positions corresponding to respective electrode pads on the wafer; an annular seal member provided on the wafer chuck, and formed to surround the wafer held by the wafer chuck; a mechanical lift having a wafer chuck fixing part which detachably fixes the wafer chuck, the mechanical lift configured to lift up and down the wafer chuck fixed to the wafer chuck fixing part; a decompressor configured to depressurize an internal space formed by the probe card, the wafer chuck and the seal member, when the wafer chuck is moved toward the probe card by the mechanical lift; a lift controller configured to control the mechanical lift to move the wafer chuck toward the probe card and bring the probes into contact with the electrode pads in an overdrive condition; and a depressurization controller configured to control the decompressor to draw the wafer chuck toward the probe card by depressurization of the internal space, after the probes come into contact with the electrode pads in the overdrive condition.

According to an aspect of the prober of the present invention, the lift controller controls the mechanical lift to move the wafer chuck toward the probe card such that the electrode pads and the probes come into contact with each other a plurality of times.

An aspect of the prober of the present invention includes a timing controller configured to release fixing of the wafer chuck by the wafer chuck fixing part at a second timing later than a first timing when the decompressor starts depressurization of the internal space.

An aspect of the prober of the present invention includes: a communication path for communicating the internal space with an external space; a shutter unit configured to open and block the communication path; and a shutter controller configured to control the shutter unit to open the communication path when the mechanical lift moves the wafer chuck toward the probe card, and control the shutter unit to block the communication path when the decompressor depressurizes the internal space.

According to an aspect of the prober of the present invention, each of the probes is a cantilever type probe.

An aspect of the prober of the present invention includes guide mechanisms configured to guide movement of the wafer chuck when the wafer chuck is drawn to move toward the probe card by depressurization of the internal space, while regulating movement of the wafer chuck in a direction orthogonal to a drawing direction in which the wafer chuck is drawn.

According to an aspect of the prober of the present invention, the guide mechanisms each include: a bearing provided in the wafer chuck; and a guide shaft detachably fixed to a probe card supporting member and pivotally supported by the bearing.

According to an aspect of the prober of the present invention, the guide mechanisms are provided in at least three positions different from each other in the direction orthogonal to the drawing direction in which the wafer chuck is drawn.

In order to achieve the above object, in a prober including: a wafer chuck configured to hold a wafer; a probe card provided facing the wafer chuck, and including probes at positions corresponding to respective electrode pads on the wafer; an annular seal member provided on the wafer chuck, and formed to surround the wafer held by the wafer chuck; and a mechanical lift having a wafer chuck fixing part which detachably fixes the wafer chuck, the mechanical lift configured to lift up and down the wafer chuck fixed to the wafer chuck fixing part, a probe contact method includes: moving the wafer chuck toward the probe card by the mechanical lift to bring the probes into contact with the electrode pads in an overdrive condition; and depressurizing an internal space formed by the probe card, the wafer chuck and the seal member, after the moving of the wafer chuck.

According to an aspect of the probe contact method of the present invention, in the moving of the wafer chuck, the mechanical lift is controlled to move the wafer chuck toward the probe card such that the electrode pads and the probes come into contact with each other a plurality of times.

An aspect of the probe contact method of the present invention includes releasing fixing of the wafer chuck by the wafer chuck fixing part at a second timing later than a first timing when the depressurizing of the internal space starts.

According to an aspect of the probe contact method of the present invention, the internal space is brought into an unsealed state when the wafer chuck is moved toward the probe card in the moving of the wafer chuck, and the internal space is brought into a sealed state when the internal space is depressurized in the depressurizing.

According to an aspect of the probe contact method of the present invention, each of the probes is a cantilever type probe.

According to an aspect of the probe contact method of the present invention includes guiding movement of the wafer chuck while regulating movement of the wafer chuck in a direction orthogonal to a drawing direction in which the wafer chuck is drawn when the wafer chuck is drawn to move toward the probe card by the depressurizing of the internal space.

According to an aspect of the probe contact method of the present invention, the guiding is performed by guide mechanisms each include: a bearing provided in the wafer chuck; and a guide shaft detachably fixed to a probe card supporting member and pivotally supported by the bearing.

According to an aspect of the probe contact method of the present invention, in the guiding, movement of the wafer chuck is guided in at least three positions different from each other in the direction orthogonal to the drawing direction in which the wafer chuck is drawn while regulating movement of the wafer chuck in the direction orthogonal to the drawing direction.

According to the present invention, it is possible to enhance the reliability of electrical contact between electrode pads on a wafer, and probes.

Further, for enhancement of the reliability of the contact, while oxide films on surfaces of the electrode pads are first scraped with the probes, thin insulating layers on the surfaces are removed, and then contact with portions where the insulating layers are peeled off is performed at appropriate pressure. Thus, it is possible to further enhance the reliability of the contact.

DETAILED DESCRIPTION OF THE EMBODIMENTS

Hereinafter, preferred embodiments of the present invention will be described with reference to the attached drawings.

First Embodiment

To begin, a first embodiment will be described.

Figure 1:
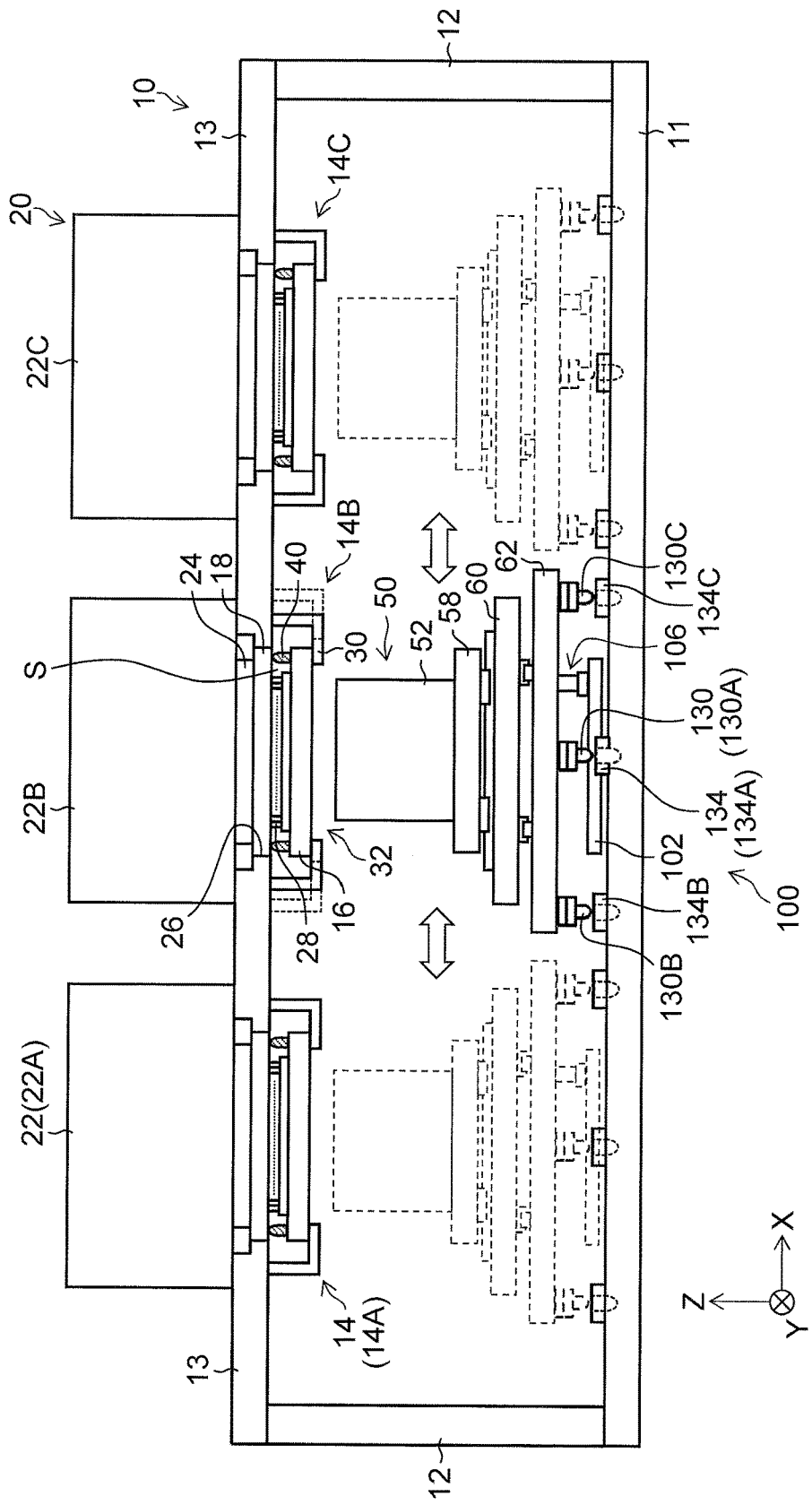
FIG. 1 is a diagram illustrating a schematic configuration of a system that performs wafer level inspection according to a first embodiment.

FIG. 1 is a diagram illustrating a schematic configuration of a system that performs wafer level inspection according to the first embodiment. The system that performs the wafer level inspection includes: a prober 10 that brings metal electrode pads of each chip on a wafer (hereinafter, also referred to as electrode pads on a wafer) into contact with probes; and a tester 20 that is electrically connected to the probes, supplies power and a test signal for electrical inspection to each chip, and detects an output signal from each chip to measure whether the proves normally operate.

In FIG. 1, a base 11, side plates 12, and a head stage 13 configure a housing of the prober 10. In some cases, an upper plate supported by the side plates 12 is provided, and the head stage 13 is provided on the upper plate.

The prober 10 is provided with a plurality of measuring units (first to third measuring units) 14A to 14C. The measuring units 14A to 14C each include a wafer chuck 16 that holds a wafer W, and a probe card 18 having a large number of probes 28 corresponding to respective electrodes of each chip on the wafer W. All chips on the wafer W held by the wafer chuck 16 is simultaneously inspected in each of the measuring units 14A to 14C. Respective configurations of the measuring units 14A to 14C are common, and therefore on behalf of these units, the measuring unit is designated by reference numeral 14.

Figure 2:
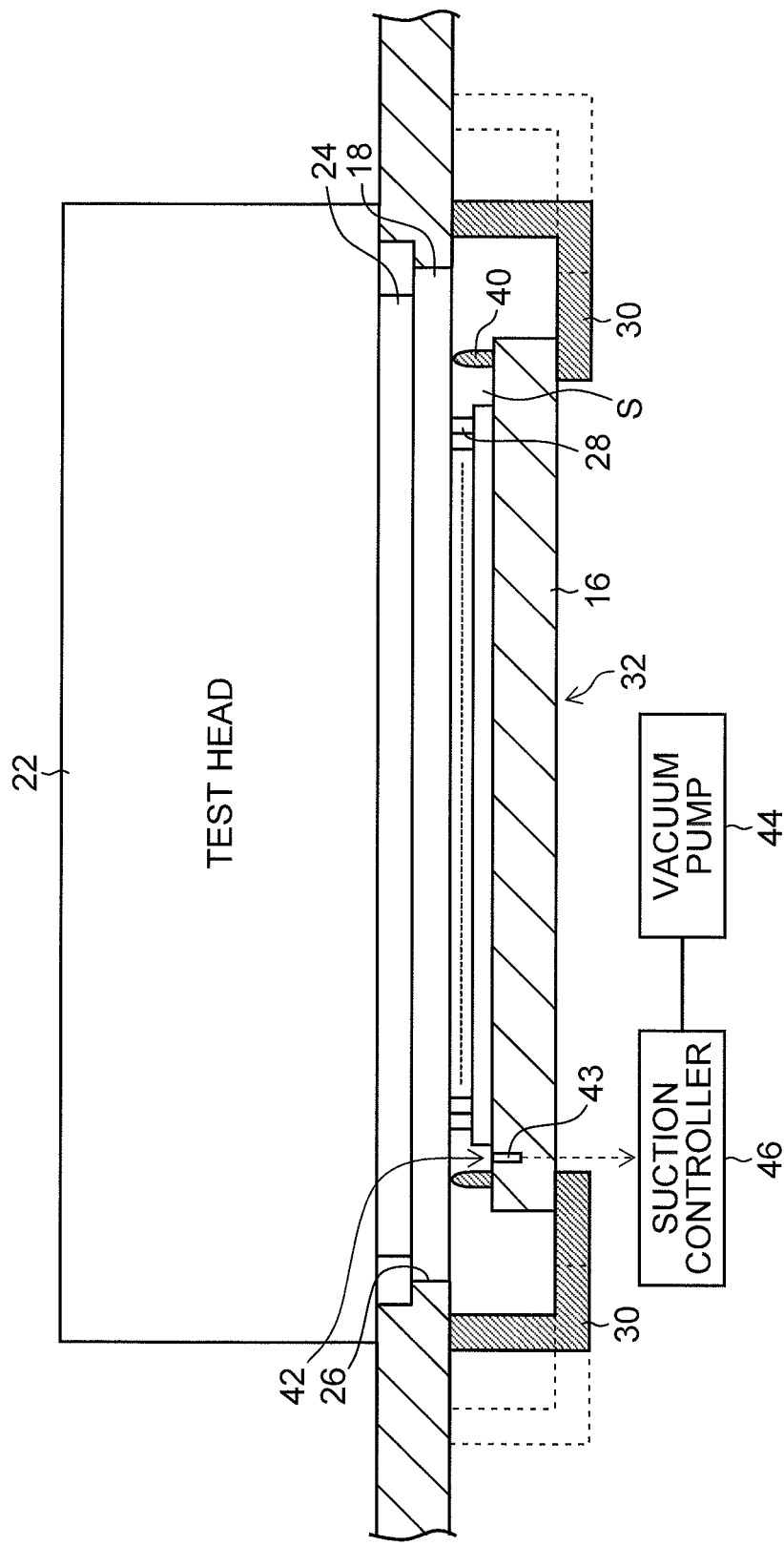
FIG. 2 is a diagram illustrating a configuration of a periphery of a probe card.

FIG. 2 is a diagram illustrating a configuration of a periphery of the probe card.

The wafer chuck 16 sucks and fixes the wafer by vacuum suction or the like. The wafer chuck 16 is detachably supported by an alignment apparatus 50 described below, and is movable in the X-Y-Z-O directions by the alignment apparatus 50.

Figure 10A:
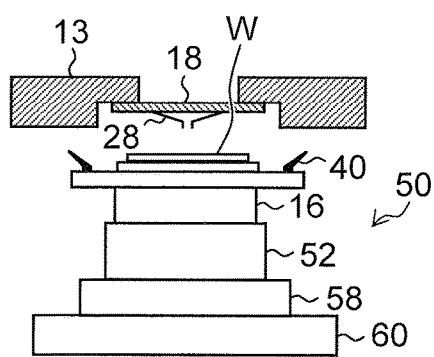
FIGS. 10A to 10E are diagrams illustrating an example of inspection operation including a probe contact method using a prober.

The wafer chuck 16 is provided with a sealing mechanism. The sealing mechanism includes a ring-shaped seal member (an example of an annular seal member, or O-ring) 40 having elasticity. The sealing member is provided in the vicinity of an outer periphery of an upper surface of the wafer chuck 16. Additionally, on the upper surface of the wafer chuck 16, a suction port 42 is provided between the wafer W and the ring-shaped seal member 40. The suction port 42 is connected to a suction controller 46 that controls vacuum pressure through a suction path 43 formed inside the wafer chuck 16. The suction controller 46 is connected to a vacuum pump 44. When the suction controller 46 is operated in a state where the ring-shaped seal member 40 comes into contact with the probe card 18 and a sealed internal space S (sealed space) surrounded by the wafer chuck 16, the probe card 18 and the ring-shaped seal member 40 is formed, the internal space S is depressurized and the wafer chuck 16 is drawn toward the probe card 18. Consequently, the probe card 18 and the wafer chuck 16 are brought into a close contact with each other, and each probe 28 comes into contact with a corresponding one of the electrode pads of each chip, thereby resulting in a state where inspection can start. As illustrated in FIG. 10B, the internal space S may be formed as a sealed internal space surrounded by the wafer chuck 16, the head stage 13, the probe card 18 and ring-shaped seal member 40 in a state where the ring-shaped seal member 40 is brought into contact with the head stage 13. The suction controller 46 is an example of depressurization control means (depressurization controller) of the present invention.

The head stage 13 (probe card supporting member) is provided with mounting holes (card mounting parts) 26 for the respective measuring units 14, and the probe cards 18 are exchangeably mounted on the respective mounting holes 26. A plurality of the spring pin type probes 28 having elasticity are formed in each probe card 18 on portions facing the respective chips so as to correspond to electrodes of all the chips on the wafer W. Herein, the probe cards 18 are directly mounted on the head stage 13. However, in some cases, card holders may be provided in the head stage 13, and the probe cards 18 are mounted on the card holders.

The tester 20 has a plurality of test heads 22 (22A to 22C) provided for the respective measuring units 14. Each test head 22 is placed on an upper surface of the head stage 13. In some cases, the respective test heads 22 may be held above the head stage 13 by a supporting mechanism (not illustrated).

Terminals of each of the test heads 22 are connected to terminals of a corresponding one of the probe cards 18 through a large number of connecting pins of a contact ring 24. Consequently, the terminals of each test head 22 are electrically brought into contact with the probes 28.

Each measuring unit 14 is provided with a supporting mechanism (chuck falling prevention mechanism) for preventing the falling of the wafer chuck 16. The supporting mechanism includes a plurality of holding parts (for example, holding tabs, holding jigs, grips and so on) 30 that hold the wafer chuck 16. The respective holding parts 30 are provided at predetermined intervals around the mounting hole 26 of the head stage 13. In this embodiment, the four holding parts 30 are provided at intervals of 90 degrees around the mounting hole 26 (only the two holding parts 30 are illustrated in FIG. 1 and FIG. 2).

The respective holding parts 30 are movable (diametrically expandable) so as to come close to or separate from each other with the mounting hole 26 as the center. Moving mechanisms (not illustrated) of the holding parts 30 are each composed of, for example, a ball screw, a motor, or the like. In a state where the respective holding parts 30 are close to each other (state illustrated by solid lines in FIG. 1 and FIG. 2), an inner diameter of a passing hole 32 formed at a central part of the holding parts 30 is smaller than a diameter of the wafer chuck 16, and therefore the wafer chuck 16 is held by the holding parts 30. On the other hand, in a state where the holding parts 30 are separated from each other (state illustrated by broken lines in FIG. 1 and FIG. 2), the inner diameter of the passing hole 32 is larger than the diameter of the wafer chuck 16, and therefore the alignment apparatus 50 can supply or retrieve each wafer chuck 16.

As a configuration of the supporting mechanism, for example, various modifications such as a configuration described in Japanese Patent Application Laid-Open No. 2010-186998 can be employed.

The prober 10 according to this embodiment includes the alignment apparatus 50 that detachably supports each wafer chuck 16 and performs alignment operation of the wafer W held by each wafer chuck 16, and a moving apparatus 100 that moves the alignment apparatus 50 between the measuring units 14 along the direction (X-axis direction) in which the measuring units 14 are arrayed.

The alignment apparatus 50 includes a moving and rotating mechanism that moves each wafer chuck 16 in the X-Y-Z-O directions, and an alignment mechanism that detects a relative positional relation between each electrode of each chip on the wafer W held by each wafer chuck 16, and a corresponding one of the probes 28 of each probe card 18. The alignment apparatus 50 detachably supports the wafer chuck 16 and performs the alignment operation of the wafer W held by the wafer chuck 16. That is, the relative positional relation between each electrode of each chip of the wafer W held by the wafer chuck 16 and the corresponding one of the probes 28 of each probe card 18 is detected, and on the basis of the detection results, the wafer chuck 16 is moved so as to bring the electrode of the chip to be inspected into contact with the probe 28. The operation of the alignment apparatus 50 is controlled by an alignment apparatus controller (not illustrated). The alignment apparatus controller is an example of lifting control means (lifting controller) of the present invention.

The alignment apparatus 50 (Z-axis moving and rotating unit 52) sucks and fixes each wafer chuck 16 by vacuum suction or the like. However, as long as the wafer chuck 16 can be fixed, any fixing means other than the means using vacuum suction may be employed. For example, mechanical means or the like may be fixed. Additionally, the alignment apparatus 50 is provided with a positioning member (not illustrated) in order to keep the relative positional relation with each wafer chuck 16 constant.

Figure 3:
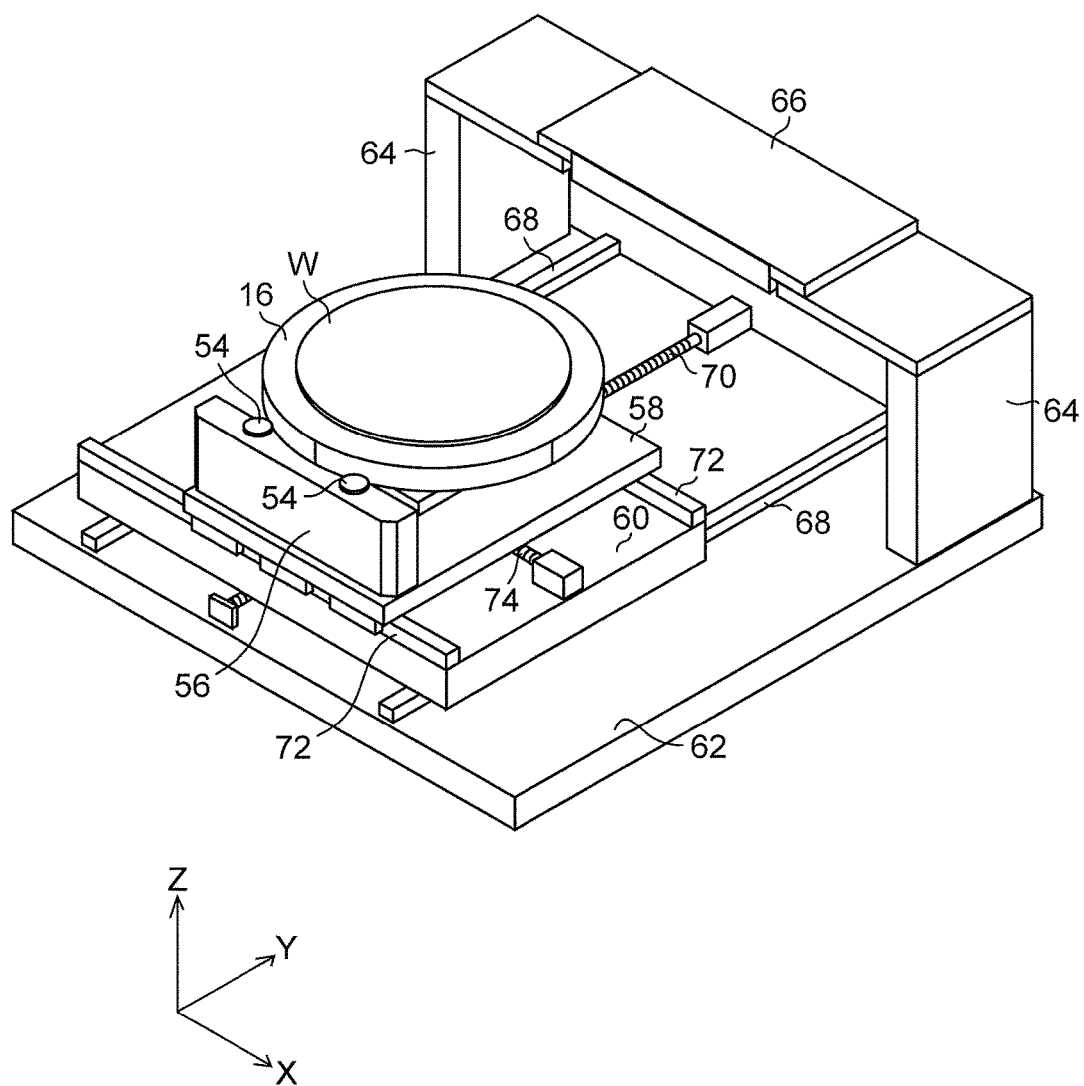
FIG. 3 is an upper perspective view illustrating a schematic configuration of an alignment apparatus.
Figure 4:
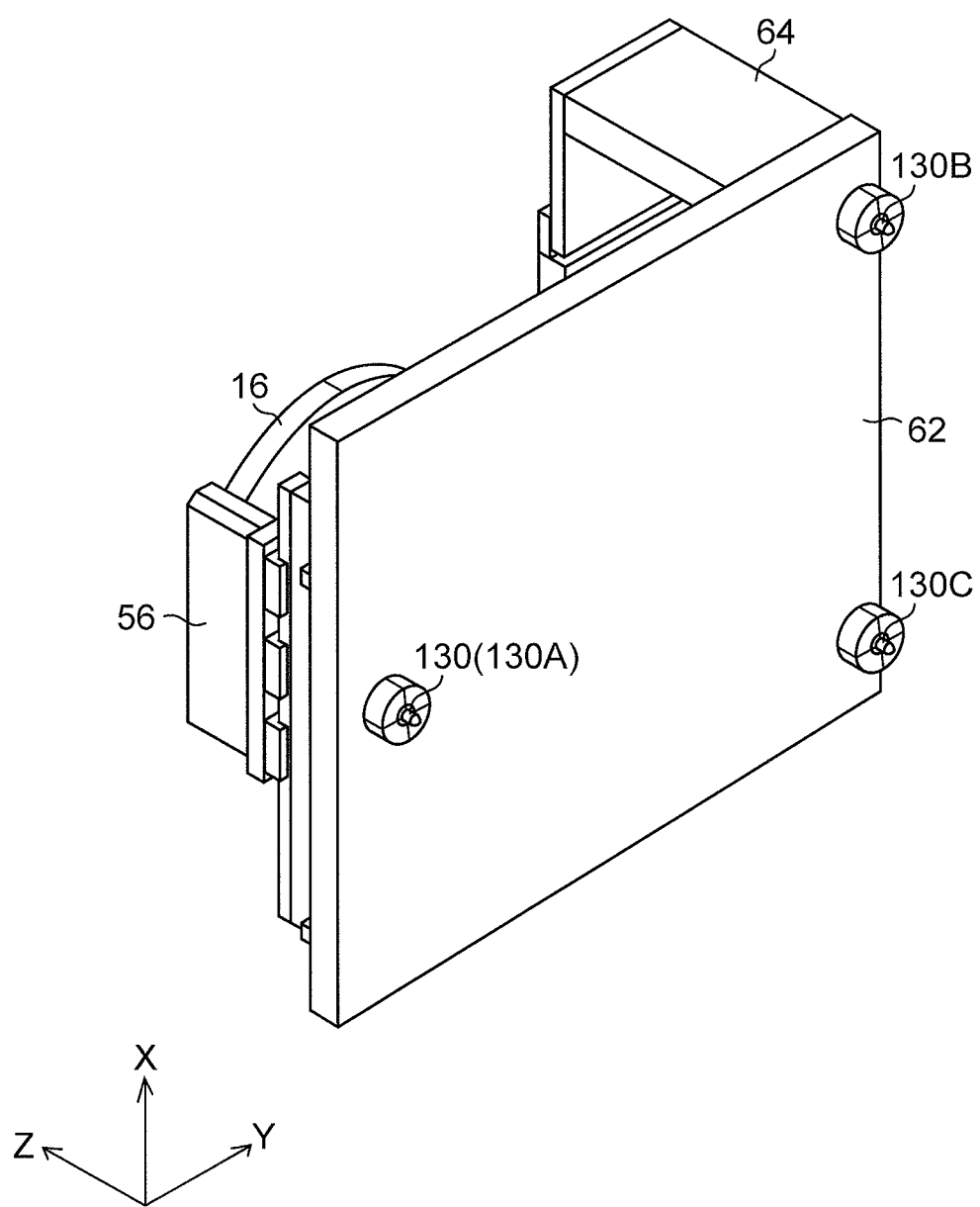
FIG. 4 is a lower perspective view illustrating the schematic configuration of the alignment apparatus.

Each of FIG. 3 and FIG. 4 is a diagram illustrating a schematic configuration of the alignment apparatus 50. More specifically, FIG. 3 is an upper perspective view of the alignment apparatus 50, and FIG. 4 is a lower perspective view of the alignment apparatus 50. FIG. 3 and FIG. 4 each illustrate a state where the wafer chuck 16 is supported on an upper surface of the alignment apparatus 50.

As illustrated in FIG. 1 and FIG. 3, the alignment apparatus 50 includes: a Z-axis moving and rotating unit (an example of mechanical lift having a wafer chuck fixing part) 52 that detachably supports the wafer chuck 16, moves the wafer chuck 16 in the Z-axis direction, and rotates it around the Z-axis; probe position detecting cameras 54 that detect positions of the probes 28; a camera moving mechanism 56 that moves the probe position detecting cameras 54 in the Z-axis direction; an X-axis moving table 58 that supports the Z-axis moving and rotating unit 52 and the camera moving mechanism 56 and moves the Z-axis moving and rotating unit 52 and the camera moving mechanism 56 in the X-axis direction; a Y-axis moving table 60 that supports the X-axis moving table 58 and moves the X-axis moving table 58 in the Y-axis direction; a base 62 that supports the Y-axis moving table 60; and an alignment camera 66 that is supported by struts 64. The moving and rotating mechanism that moves the wafer chuck 16 in the X-Y-Z-θ directions includes: the Z-axis moving and rotating unit 52; the X-axis moving table 58; and the Y-axis moving table 60. Additionally, the alignment mechanism includes: the probe position detecting cameras 54; the alignment camera 66; the camera moving mechanism 56; and an image processing unit (not illustrated).

Two guide rails 68 are provided in parallel to each other on the base 62, and the Y-axis moving table 60 is movable on these guide rails 68. A drive motor and a ball screw 70 that is rotated by this drive motor are provided in a portion between the two guide rails 68 on the base 62. The ball screw 70 engages with a bottom surface of the Y-axis moving table 60, and the Y-axis moving table 60 slides on the guide rails 68 by rotation of the ball screw 70.

Two parallel guide rails 72 that are orthogonal to the two guide rails 68 are provided on the Y-axis moving table 60, and the X-axis moving table 58 is movable on these guide rails 72. A drive motor and a ball screw 74 that is rotated by this drive motor are provided in a portion between the two guide rails 72 on the Y-axis moving table 60. The ball screw 74 engages with a bottom surface of the X-axis moving table 58, and the X-axis moving table 58 slides on the guide rails 72 by rotation of the ball screw 74.

In some cases, a linear motor may be used in place of the ball screw.

Now, a configuration of the moving apparatus 100 will be described.

As illustrated in FIG. 1, the moving apparatus 100 has a conveying pallet 102 on which the alignment apparatus 50 is to be placed, and conveys the alignment apparatus 50. The conveying pallet 102 is configured to be movable between the respective measuring units 14 along the X-axis direction. As a moving mechanism (horizontal feeding mechanism) for moving the conveying pallet 102, any linear moving mechanism may be employed. For example, the moving mechanism may be configured by a belt driving mechanism, a linear guide mechanism, a ball screw mechanism or the like. Additionally, the conveying pallet 102 is provided with a lifting mechanism 106 that lifts the alignment apparatus 50 up and down in the Z-axis direction. The lifting mechanism 106 is configured by a known cylinder mechanism or the like. Consequently, the alignment apparatus 50 is movable between the respective measuring units 14 along the X-axis direction, and is liftable up and down in the Z-axis direction.

The moving mechanism of the conveying pallet 102, and the lifting mechanism 106 are driven by control of control means (not illustrated).

Figure 5:
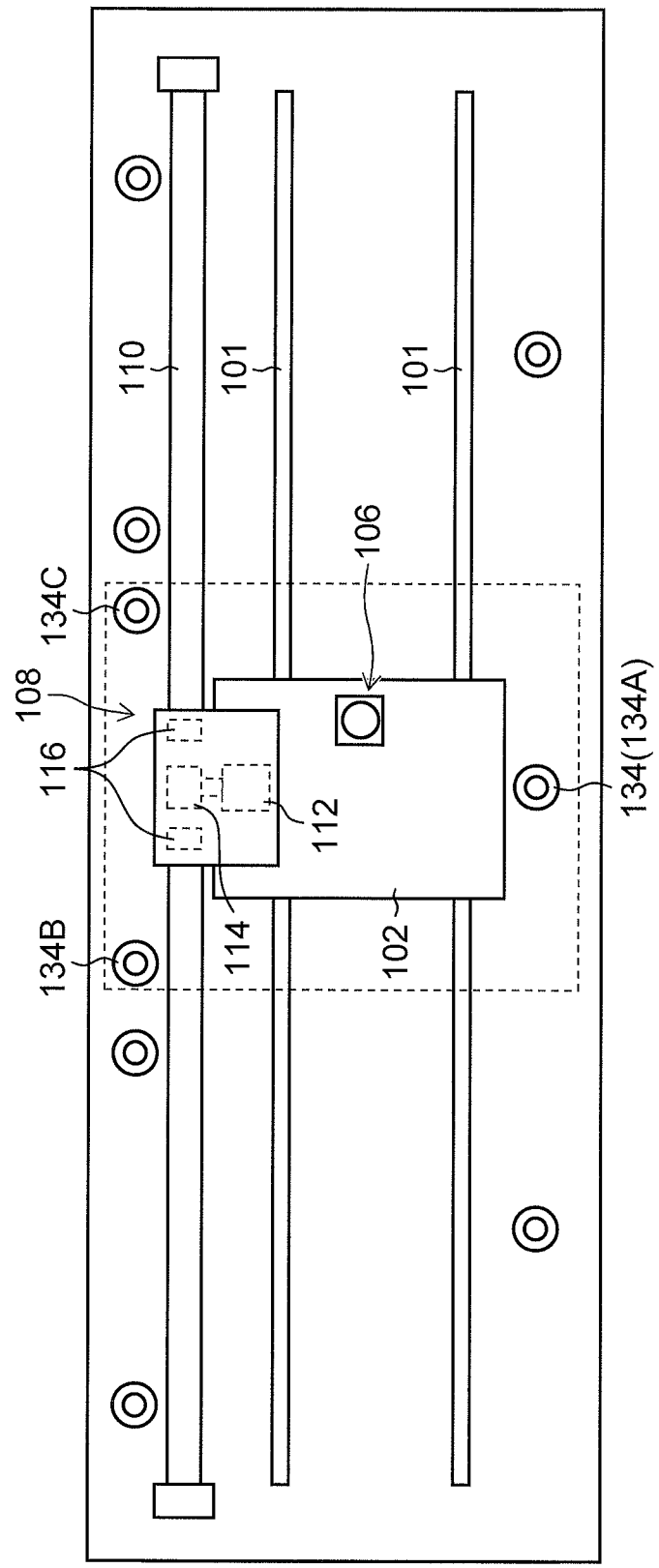
FIG. 5 is a plan view schematically illustrating a configuration example of a moving apparatus.
Figure 6:
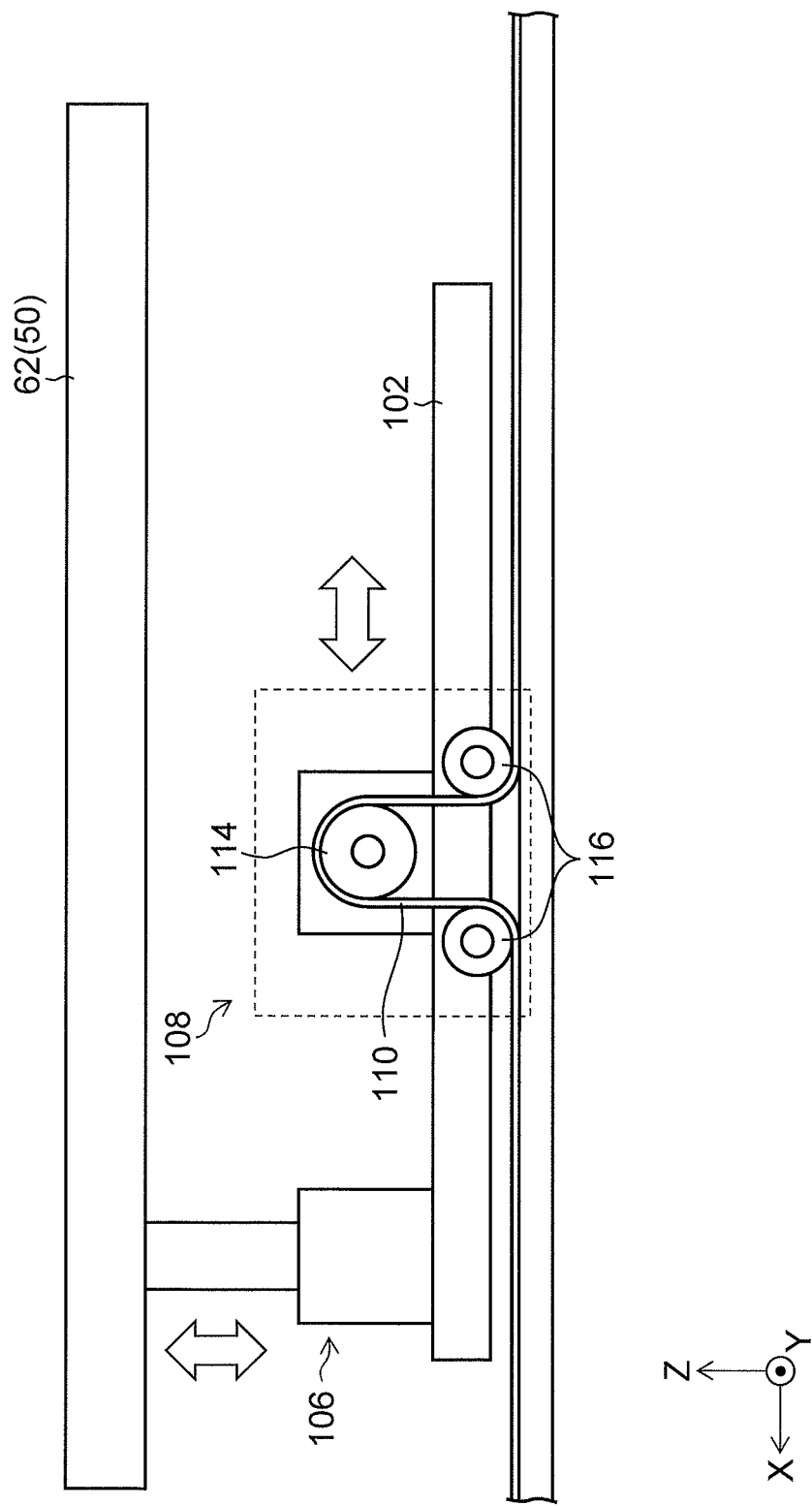
FIG. 6 is a side view schematically illustrating the configuration example of the moving apparatus.

Each of FIG. 5 and FIG. 6 is a schematic view illustrating a configuration example of the moving apparatus 100. More specifically, FIG. 5 is a plan view of the moving apparatus 100, and FIG. 6 is a side view of the moving apparatus 100.

As illustrated in FIG. 5 and FIG. 6, two guide rails 101 are provided in parallel to each other on the base 11, and the conveying pallet 102 is movable on these guide rails 101. Additionally, a timing belt 110 that is parallel to the guide rails 101, and has both ends fixed to the base 11 is provided on an outside portion of the two guide rails 101.

A driving unit 108 is fixed to the conveying pallet 102. The driving unit 108 has a drive motor 112, a drive pulley 114 connected to a rotating shaft of the drive motor 112, and two idle pulleys 116 disposed around the drive pulley 114. The timing belt 110 is wound on the drive pulley 114, and tension of the timing belt 110 is adjusted by the idle pulleys 116 disposed on both sides of the timing belt. When the drive motor 112 is driven, the conveying pallet 102 slides on the guide rails 101 by rotation of the drive pulley 114. Consequently, the alignment apparatus 50 supported by the conveying pallet 102 moves between the respective measuring units 14 along the X-axis direction.

Figure 7:
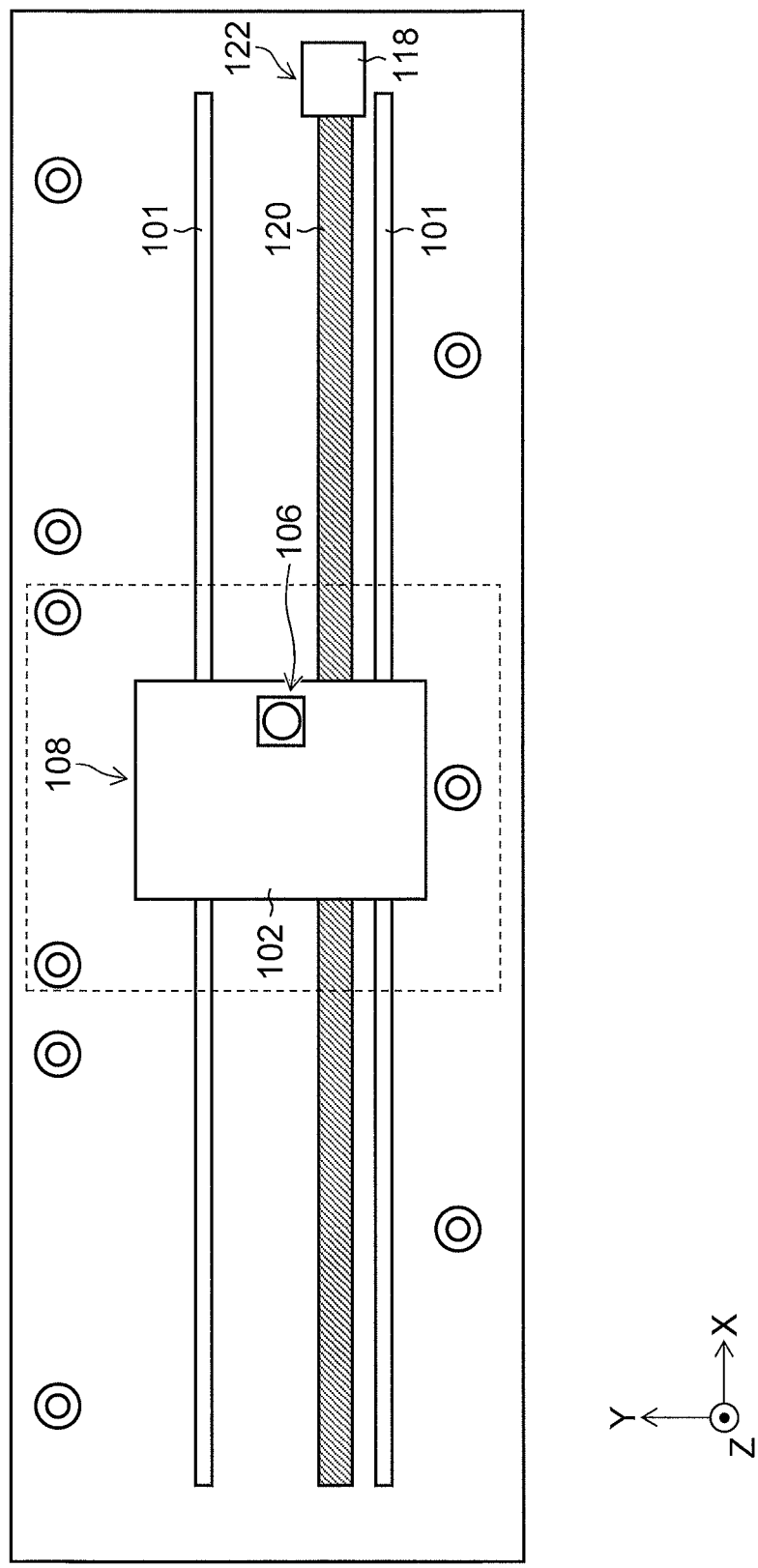
FIG. 7 is a plan view schematically illustrating another configuration example of the moving apparatus.

FIG. 7 is a schematic view illustrating another configuration example of the moving apparatus 100. In the configuration example illustrated in FIG. 7, a ball screw mechanism is utilized. That is, in a base 11, a driving unit 108 including a drive motor 118 and a ball screw 120 is provided between two guide rails 101. The ball screw 120 engages with a bottom surface of a conveying pallet 102, and the conveying pallet 102 slides on the guide rails 101 by rotation of the ball screw 120. Consequently, an alignment apparatus 50 supported by the conveying pallet 102 moves between respective measuring units 14 along the X-axis direction.

In this embodiment, there is provided a positioning and fixing apparatuses having a clamp mechanisms which positions three portions of the alignment apparatus 50 having moved to each measuring unit 14, and detachably grips and fixes the alignment apparatus 50. More specifically, in the alignment apparatus 50, a plurality of positioning pins 130 (130A to 130C) are respectively provided at three portions of the base 62. On the other hand, in the base 11 of the housing, a plurality of chuck members (positioning holes) 134 (134A to 134C) that clamp the respective positioning pins 130 are provided. The plurality of chuck members are provided for each measuring unit 14. The clamp mechanism includes the positioning pins 130 and the chuck members 134.

As the clamp mechanism, for example, a known clamp mechanism such as a ball lock type clamp mechanism and a tapered sleeve clamp mechanism is applied, and therefore detailed description will be omitted herein.

Figure 8:
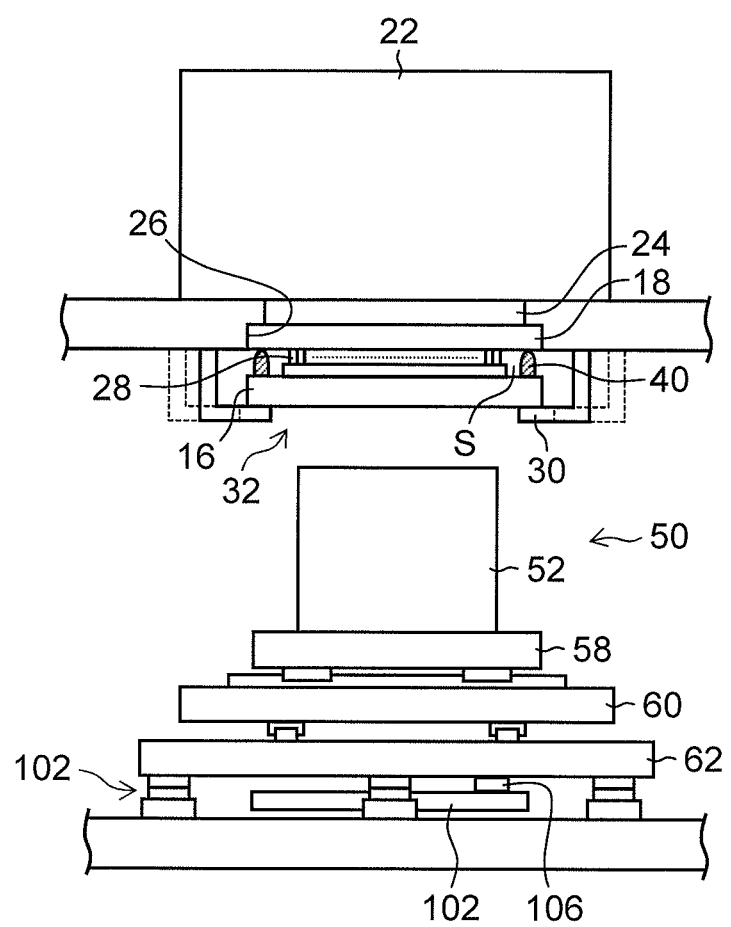
FIG. 8 is a diagram illustrating a state where the alignment apparatus is positioned and fixed.

In a case where the alignment apparatus 50 which has moved to one measuring unit 14 is positioned and fixed, the alignment apparatus 50 is lifted down by the lifting mechanism 106, and the respective positioning pins 130 are fitted into the respective corresponding chuck members 134 and clamped, as illustrated in FIG. 8. Consequently, the alignment apparatus 50 is positioned in the horizontal direction and the vertically direction, and the alignment apparatus 50 is fixed to the base 11 in a state where rotation of the alignment apparatus 50 around the vertical direction is constrained. On the other hand, in a case where the alignment apparatus 50 moves to other measuring units 14, the alignment apparatus 50 is lifted up by the lifting mechanism 106, and the positioning pins 130 are separated from the respective chuck members 134. Consequently, positioning and fixing of the alignment apparatus 50 is released, and the alignment apparatus 50 becomes movable to other measuring units 14 by the moving apparatus 100.

Here, the prober 10 includes an overall controller (not illustrated) that integrally controls each part of the prober 10. Inspection operation described below is performed by control of each part by the suction controller 46 and the alignment apparatus controller under control by the overall controller.

Now, inspection operation including a probe contact method using the prober 10 according to the first embodiment will be described.

FIGS. 10A to 10E illustrate an example of the inspection operation including the probe contact method using the prober 10 according to the first embodiment.

First, the alignment apparatus 50 is moved to the measuring unit 14 which is going to perform inspection, and is positioned and fixed. Then, the Z-axis moving and rotating unit 52 is lifted up such that the wafer chuck 16 is detachably supported by the alignment apparatus 50 (Z-axis moving and rotating unit 52). The wafer chuck 16 is supported by the alignment apparatus 50 (Z-axis moving and rotating unit 52) in a state of being fixed by, for example, vacuum suction. In this state, depressurization of the internal space S by the suction controller 46 is released, the holding parts 30 of the supporting mechanism are separated from each other, and thereafter the wafer chuck 16 is lifted down by the Z-axis moving and rotating unit 52.

Next, the alignment apparatus 50 supporting the wafer chuck 16 is moved to a predetermined delivery position, and the wafer W is loaded on the wafer chuck 16 by a wafer delivery mechanism (loader) (not illustrated), and is fixed by vacuum suction.

Then, alignment operation is performed. More specifically, the X-axis moving table 58 is moved such that the probe position detecting cameras 54 are located under the probes 28, the probe position detecting cameras 54 are moved in the Z-axis direction by the camera moving mechanism 56 to adjust focus of the probe position detecting cameras 54, and the probe position detecting cameras 54 detect the tip position of each probe 28. A position in a horizontal plane of the tip of each probe 28 (X and Y coordinates) is detected by coordinates of the cameras, and a vertical position of the tip of each probe 28 is detected by focal positions of the cameras. Generally, several hundreds to several thousands or more of the probes 28 are provided on the probe card 18, and the tip positions of all the probes 28 are not detected, but the tip positions of specified probes are typically detected.

Next, the X-axis moving table 58 is moved such that the wafer W is located under the alignment camera 66 in a state where the wafer W to be inspected is held by the wafer chuck 16. Then, positions of the electrode pads of each chip on the wafer W are detected. The positions of all the electrode pads of one chip do not need to be detected, and the positions of some of the electrode pads only need to be detected. Additionally, the electrode pads of all the chips on the wafer W do not need to be detected, and the positions of the electrode pads of some of the chips are detected.

Then, the wafer chuck 16 is rotated by the Z-axis moving and rotating unit 52 such that the array direction of the probes 28 and the array direction of the electrode pads coincide with each other on the basis of the array of the probes 28 and the array of the electrode pads detected as described above, and thereafter the wafer chuck 16 is moved in the X-axis direction and the Y-axis direction such that the electrode pads of the chips to be inspected are located below the probes 28 (refer to FIG. 10A). The Z-axis moving and rotating unit 52 lifts the wafer chuck 16 up in the Z-axis direction while detachably supporting the wafer chuck 16. That is, the wafer chuck 16 is moved in such a direction that the wafer chuck 16 and the probe card 18 come close to each other.

More specifically, as illustrated in FIG. 10B, the ring-shaped seal member 40 provided on the wafer chuck 16 is brought into contact with the head stage 13 (or may be probe card 18), and the internal space S surrounded by the wafer chuck 16, the head stage 13, the probe card 18, and the ring-shaped seal member 40 (or may be the internal space S surrounded by the wafer chuck 16, the probe card 18, and the ring-shaped seal member 40) is formed, and further the electrode pads on the wafer W held by the wafer chuck 16 and the probes 28 provided in the probe card 18 are brought into contact with each other (first contact).

The Z-axis moving and rotating unit 52 lifts up the wafer chuck 16 up to a predetermined position Po1 at the predetermined speed V1 (or acceleration) with respect to the probe card 18 (probes 28), thereby performing the first contact.

The Z-axis moving and rotating unit 52 is driven by the motor, and therefore the wafer chuck 16 can be moved up to an arbitrary position (height) at an arbitrary speed (or acceleration).

The position Po1 is a position where the electrode pads on the wafer W and the probes 28 come into contact with each other at contact pressure Pr1. The speed V1 (or acceleration) is the speed (or acceleration) that is considered so as to obtain electrical connection between the electrode pads and the probes 28 by rubbing the tips of the probes 28 on the electrode pads and scraping (breaking) oxide films as insulators formed on the electrode pads when the electrode pads on the wafer W and the probes 28 come into contact with each other. The speed V1 is, for example, 20 to 30 [mm/sec].

By the first contact, it is possible to enhance the reliability of electrical contact between the electrode pads on the wafer W and the probes 28.

In the first contact, in order to attain a state where the oxide films are reliably scraped at final contact positions, it is important that overdrive is performed by the Z-axis moving and rotating unit 52, that is, the wafer chuck 16 is pushed toward the probe card 18 beyond a height at which the electrode pads come into contact with the probes 28. It is required that the wafer chuck 16 is pushed toward the probe card 18 slightly beyond a final expected contact position such that the oxide films are reliably scraped away, and final contact is taken at positions where the oxide films are reliably scraped. Therefore, it is important that the wafer chuck 16 is moved up to the predetermined contact position while the Z-axis moving and rotating unit 52 mechanically drives the wafer chuck 16 with the motor. For example, in place of a process of moving the wafer chuck 16 in the Z direction by the Z-axis moving and rotating unit 52 for scraping the oxide films away, in a case where the wafer chuck 16 is moved by depressurization by the suction controller 46 (vacuum pump 44), the electrode pads sometimes come into contact with the probes 28 while the wafer chuck 16 is inclined to the probe card 18. In this case, there is a problem that the oxide films on the electrode pads' surfaces are not completely scraped away.

In order to completely scrape the surface oxide films, it is essential that the wafer chuck 16 is reliably moved up to the predetermined contact position at the predetermined speed by the Z-axis moving and rotating unit 52 with driving of the motor as mechanical movement, and it is essential that the wafer chuck 16 is pushed toward the probe card 18 beyond the contact position such that the insulating oxide films formed on the surfaces are reliably scraped.

Thereafter, in order to make contact at predetermined pressure, the wafer chuck 16 is lifted down once, and thereafter contact may be made again while depressurization is performed by the suction controller 46 (vacuum pump 44). As a result, after the surface oxide films are scraped away, the second (or third) contact is made. It is possible to bring the electrode pads into contact with the probes at a constant pressure in a reliable contact state.

Figure 10D:
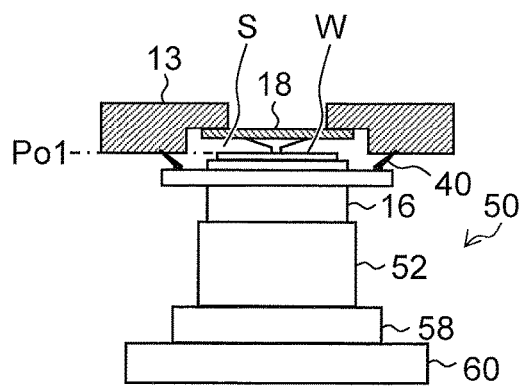
Figure 10B:
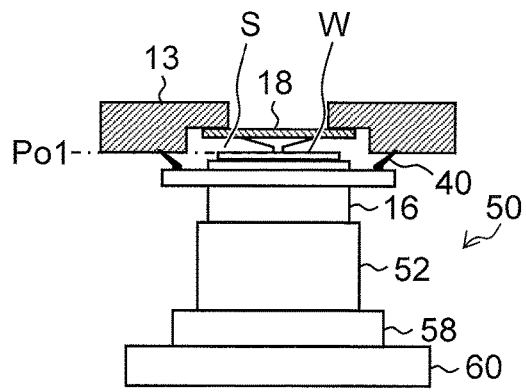
Figure 10E:
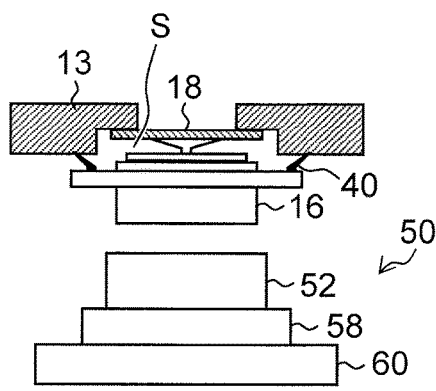
Figure 10C:
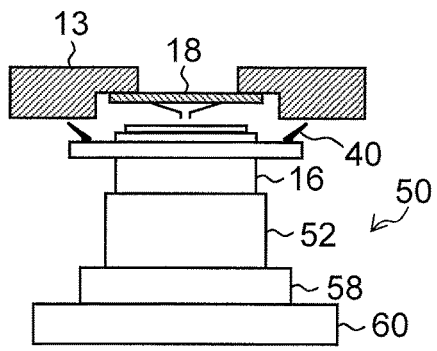

Now, as illustrated in FIG. 10C, the Z-axis moving and rotating unit 52 lifts the wafer chuck 16 down in the Z-axis direction while detachably supporting the wafer chuck 16, and thereafter, as illustrated in FIG. 10D, the wafer chuck 16 is lifted up again up to a position Po1 (chuck delivery height) at the speed V1 (or acceleration) similarly to the above such that the internal space S is formed, and further the electrode pads on the wafer W held by the wafer chuck 16 and the probes 28 provided on the probe card 18 are brought into contact with each other (second contact). The position Po1 and the speed V1 (or acceleration) in the second contact may be the same as or different from the position Po1 and the speed V1 (or acceleration) in the first contact.

The position Po1 in the second contact is a position which is determined such that the contact pressure of the electrode pads on the wafer W to the probes 28 becomes the contact pressure Pr1 which is lower than the below described target contact pressure Pr2 (for example, the contact pressure Pr1 which is approximately 70% of the target contact pressure Pr2) when the wafer chuck 16 reaches the position Po1 in the second contact.

The above second contact is expected to remove the oxide films that have not been removed in the first contact, and therefore it is possible to further enhance the reliability of electrical contact between the electrode pads on the wafer W and the probes 28.

As described above, a plurality of times of contact steps (for example, the first contact and the second contact) are performed, and thereafter fixing (for example, fixing by vacuum suction) between the wafer chuck 16 and the alignment apparatus 50 (Z-axis moving and rotating unit 52) is released. Thereafter, the suction controller 46 is operated, and the internal space S is depressurized by the vacuum pump 44 as a driving source, so that a depressurizing step is performed to further reduce a distance between the wafer chuck 16 and the probe card 18 (probes 28). The depressurizing step is performed after the final contact step (for example, the second contact) among the plurality of times of the contact steps (for example, the first contact and the second contact) has been performed, and is not performed after any contact step other than the final contact step. Consequently, as illustrated in FIG. 10E, the wafer chuck 16 is drawn toward the probe card 18 at the speed V2 with respect to the probe card 18 (probes 28) to be separated (detached) from the alignment apparatus 50 (Z-axis moving and rotating unit 52). The probe card 18 and the wafer chuck 16 are brought into a close contact state, and the probes 28 on the probe card 18 come into contact with the respective corresponding electrode pads at uniform contact pressure. Because the driving source is the vacuum pump 44, the speed V2 is slower than the speed V1 (speed V2<speed V1), and is, for example, 0.25 [mm/sec].

Figure 12A:
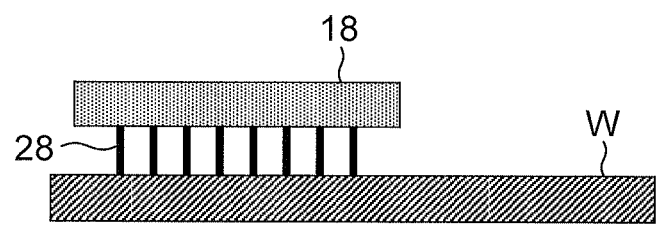
FIG. 12A is a diagram illustrating an example of vertical probes.
Figure 12B:
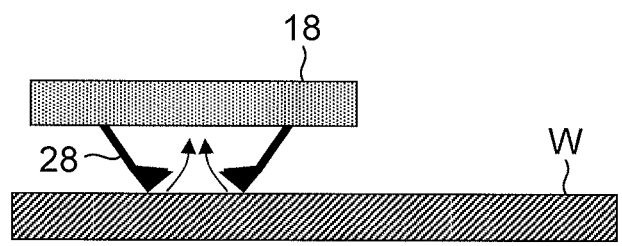
FIG. 12B is a diagram illustrating an example of cantilever type probes.

As the probes 28 on the surface of the probe card 18, there are two types, namely vertical probes (refer to FIG. 12A) and cantilever type probes (refer to FIG. 12B).

In the case of the vertical probes, after probe tips push in surfaces of insulating oxide films, and the insulating oxide films are broken by the push-in force, conduction between the probes and the electrode pads is attained by pressing at predetermined pressure. At this time, probe positions where the insulating films are broken by movement of the wafer chuck 16 in the Z-axis direction and probe positions where subsequent depressurization is performed and conduction is attained at the predetermined pressure stay at the constant position. A problem occurs when the probes are pushed inward to be buckled such that the probe tips move from positions where the oxide films have been broken. Therefore, it is necessary to improve a clearance (distance or gap) when the push-in is performed.

On the other hand, in a case of cantilevers (cantilever type probes), pushing in the electrode pads toward the probes by movement of the chuck in the Z direction corresponds to movement of the probes within electrode pad planes in the frond-back direction. Consequently, the probe tips preferably linearly scratch the pad surfaces in one direction, and this scratch preferably linearly scrapes off insulating films on the surfaces to form grooves. For example, the wafer chuck 16 is first moved up to a predetermined position slightly overdriven over a position where the probes are pressed at predetermined pressure. Then, the probe tips linearly scratch the electrode pad surfaces of the wafer, and linear grooves are formed on the electrode pad surfaces. Thereafter, when the internal space is depressurized and the probes are pressed at predetermined pressure, the probe tips come into the previously scratched linear grooves. Thus, it is possible to stably attain conduction between the probes and the electrode pads.

From the above, in the cantilever type, the grooves of linear scratched marks are formed by the movement of the wafer chuck 16 in the Z direction, and therefore it is possible to stably remove the oxide films. Additionally, because the lengths of the formed grooves are determined by an amount of movement of the wafer chuck 16 in the Z direction, it is possible to form the grooves having stable lengths and depths. After the formation of the scratched grooves, the sealed space is depressurized so that the wafer chuck 16 are brought into contact with the probe tips at predetermined pressure. At this time, the probe tips stay in the grooves, and conduction between the probes and the electrode pads can be stably attained. Therefore, the cantilever type probes have a significant advantage.

Here, in a case where the movement in the Z direction is performed by suction of the wafer chuck 16 by the depressurization means (the suction controller 46, the vacuum pump 44), the wafer chuck 16 is sometimes lifted up obliquely to the probe card 18. Thus, the predetermined scratched grooves cannot be formed with excellent reproducibility.

The suction controller 46 (vacuum pump 44) depressurizes the internal space S until the contact pressure of the electrode pads on the wafer W to the probes 28 becomes a target contact pressure Pr2 (target contact pressure Pr2>contact pressure Pr1). The target contact pressure Pr2 is a contact pressure which is determined so as to enhance the reliability of electrical contact between the electrode pads on the wafer W and the probes 28.

On the other hand, when the probe card 18 and the wafer chuck 16 are brought into close contact with each other by depressurization of the internal space S by the vacuum pump

44, the Z-axis moving and rotating unit 52 is lifted down in the Z-axis direction, and the wafer chuck 16 is separated from the alignment apparatus 50. Additionally, in order to prevent falling of the wafer chuck 16, the holding parts 30 of the supporting mechanism are brought close to each other.

Then, power and a test signal are supplied to each chip on the wafer W from each test head 22, a signal output from each chip is detected, and electrical operation is inspected.

Hereinafter, also in each of other measuring units 14, after the wafer W is loaded on the wafer chuck 16, alignment operation and contact operation in each measuring unit 14 are performed, and then simultaneous inspection of each chip of the wafer W is sequentially performed, by the same procedure. That is, power and a test signal are supplied to each chip of the wafer W from each test head 22, a signal output from each chip is detected, and electrical operation is inspected. The inspection may be performed in a state where the wafer chuck 16 is supported by the alignment apparatus 50.

When the inspection is completed in each measuring unit 14, the alignment apparatus 50 sequentially moves to each measuring unit 14, and retrieves each wafer chuck 16 that holds the inspected wafer W.

That is, in a case where the inspection in each measuring unit 14 is completed, the alignment apparatus 50 moves to the measuring unit 14 which has completed the inspection, and is positioned and fixed. Then, the Z-axis moving and rotating unit 52 is lifted up in the Z-axis direction, and the wafer chuck 16 is supported by the alignment apparatus 50. Thereafter, depressurization of the internal space S by the suction controller 46 is released. More specifically, atmospheric pressure is introduced into the internal space S. Consequently, the close contact state between the probe card 18 and the wafer chuck 16 is released. Then, the holding parts 30 of the supporting mechanism are expanded to be apart from each other in a radial direction. Thereafter, the Z-axis moving and rotating unit 52 lifts the wafer chuck 16 down in the Z-axis direction, and positioning and fixing of the alignment apparatus 50 is released. Thereafter, the alignment apparatus 50 is moved to the predetermined delivery position, fixing of the inspected wafer W is released, and the inspected wafer W is unloaded from the wafer chuck 16. The unloaded inspected wafer W is retrieved by a delivery mechanism.

In this embodiment, as illustrated in FIG. 1, the single wafer chuck 16 is assigned to each measuring unit 14. However, a plurality of wafer chucks 16 may be delivered between the plurality of measuring units 14.

As described above, according to this embodiment, it is possible to enhance the reliability of electrical contact between the electrode pads on the wafer W and the probes 28.

The reason for the effect is explained below. Because the lift up speed V1 of the wafer chuck 16 by the Z-axis moving and rotating unit 52 having the motor as a driving source is faster than the drawing speed V2 of the wafer chuck 16 having the vacuum pump 44 as a driving source (V1>V2), the electrode pads on the wafer W come into contact with the probes 28 provided on the probe card 18 at the faster speed V1, and the tips of the probes 28 are rubbed on the electrode pads such that the oxide films as insulators formed on the electrode pads are scraped (broken), and electrical connection between the electrode pads and the probes 28 is obtained.

According to this embodiment, contact between the electrode pads on the wafer W and the probes 28 (contact at the speed V1) is performed a plurality of times (for example, the first contact and the second contact), and therefore the reliability of the electrical contact between the electrode pads on the wafer W and the probes 28 can be enhanced compared to a case where the contact between the electrode pads on the wafer W and the probes 28 is performed once.

According to this embodiment, the contact pressure of the electrode pads on the wafer W to the probes 28 in the depressurizing step can be easily made to be the target contact pressure Pr2.

The reason for the effect is explained below. The contact pressure of the electrode pads on the wafer W to the probes 28 in the final contact step (for example, the second contact) is made to be the contact pressure Pr1 lower than the target contact pressure Pr2 (for example, the contact pressure Pr1 which is approximately 70% of the target contact pressure Pr2), and thereafter the internal space S is depressurized until the contact pressure of the electrode pads on the wafer W to the probes 28 becomes the target contact pressure Pr2 in the depressurizing step.

Here, It is also conceivable that the contact pressure of the electrode pads on the wafer W to the probes 28 in the final contact step (for example, the second contact) is made to the target contact pressure Pr2, and thereafter the internal space S is depressurized such that the contact pressure of the electrode pads on the wafer W to the probes 28 in the depressurizing step is maintained at the target contact pressure Pr2 in the final contact step. However, in this case, it is difficult to control depressurization of the internal space S such that the target contact pressure Pr2 in the final contact step is maintained.

On the other hand, in the former case, the contact pressure of the electrode pads on the wafer W to the probes 28 is first made to be the contact pressure Pr1 lower than the target contact pressure Pr2 in the final contact step, and thereafter the depressurization of the internal space S is controlled until the contact pressure becomes the target contact pressure Pr2 in the depressurizing step. Thus, the contact pressure of the electrode pads on the wafer W to the probes 28 in the depressurizing step can be easily made to be the target contact pressure Pr2.

In this embodiment, a mode in which fixing between the wafer chuck 16 and the alignment apparatus 50 (Z-axis moving and rotating unit 52) is released at a timing (second timing) later than a timing (first timing) of starting depressurization of the internal space S can be preferably employed. That is, after a plurality of times of the contact steps (for example, the first contact and the second contact) are performed, the suction controller 46 is operated and the depressurization of the internal space S is started by the vacuum pump 44 as the driving source. Then, when the internal pressure of the internal space S becomes a predetermined setting pressure (target pressure), fixing between the wafer chuck 16 and the alignment apparatus 50 (Z-axis moving and rotating unit 52) (for example, fixing by vacuum suction) is released. This operation is implemented by control by the suction controller 46 in cooperation with the alignment apparatus controller, under control of the overall controller that functions as timing control means (timing controller) of the present invention.

According to the above mode, because the fixing of the wafer chuck 16 is released after the depressurization of the internal space S is started, it is possible to eliminate an unstable state (free state) in which the wafer chuck 16 is not fixed on either side at a moment of switching these steps, and operation of delivering the wafer chuck 16 can be stably performed. Thus, it is possible to implement excellent contact between the electrode pads on the wafer W and the probes 28.

In addition, in the above mode, a mode in which a throttle valve that controls a flow rate of gas is provided in a suction route for sucking the wafer chuck 16 to fix the wafer chuck to the alignment apparatus 50 (Z-axis moving and rotating unit 52) is more preferable. According to this mode, even when the fixing of the wafer chuck 16 is released after the depressurization of the internal space S is started, negative pressure on the lower side (Z-axis moving and rotating unit 52 side) of the wafer chuck 16 is not abruptly lost. Therefore, because the wafer chuck 16 is abruptly never free from restraint (that is, a fixing force by suction from the Z-axis moving and rotating unit 52) from the lower side in a state where the wafer chuck 16 is drawn from both the upper and lower sides (that is, both the Z-axis moving and rotating unit 52 side and the probe card 18 side), abrupt movement of the wafer chuck 16 does not occur and it is possible to reduce generation of abnormal vibration or abnormal contact. Therefore, when the fixing of the wafer chuck 16 is released after the depressurization of the internal space S is started, it is possible to suppress abrupt separation of the wafer chuck 16 from the alignment apparatus 50 (Z-axis moving and rotating unit 52), and therefore it is possible to more stably perform the operation of delivering the wafer chuck 16.

The following configuration can be also employed as a modification of this embodiment. The same is applicable to other embodiments described below.

In this embodiment, the contact step is performed twice, after the final contact step is performed, the depressurizing step is performed. However, the present invention is not limited to this. The contact step may be performed only once, and thereafter depressurizing step may be performed. Additionally, the contact step may be performed three times, the final contact step may be performed, and thereafter the depressurizing step may be performed.

In this embodiment, the three measuring units 14 are configured so as to be arrayed along the X-axis direction. However, the number and the arrangement of the measuring units 14 are not particularly limited. For example, the plurality of measuring units 14 may be two-dimensionally arranged in the X-axis direction and the Y-axis direction.

Figure 9:
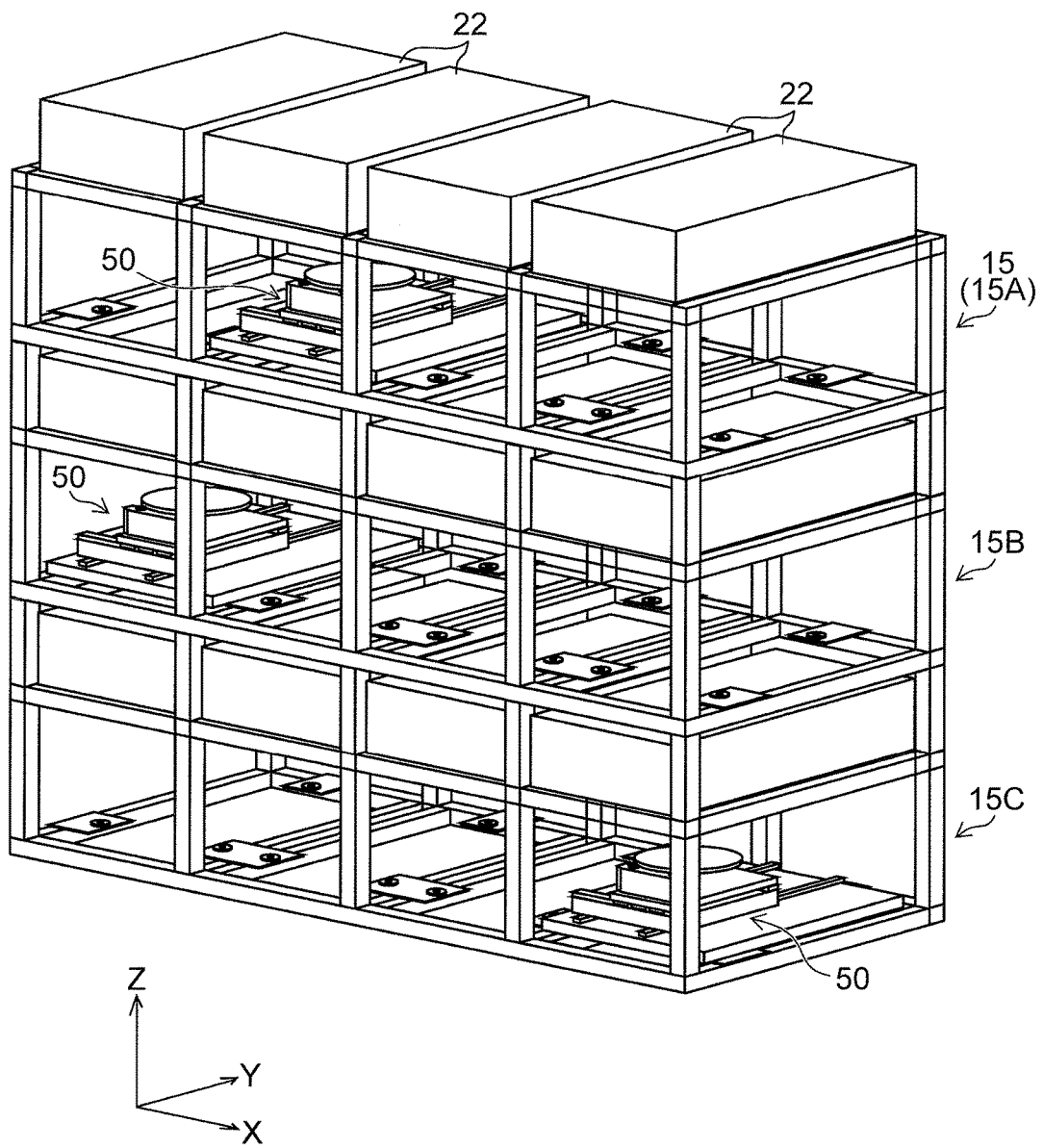
FIG. 9 is a diagram illustrating a configuration in which measuring unit groups each including a plurality of measuring units are stacked in the vertically direction.

Additionally, measuring unit groups each composed of the plurality of measuring units 14 may be stacked in multi-stages in the Z-axis direction. For example, a configuration example illustrated in FIG. 9 is a configuration in which measuring unit groups 15 (15A to 15C) each composed of four measuring units 14 are stacked in three stages in the Z-axis direction. In this configuration, the alignment apparatus 50 is provided for each measuring unit group 15, and the alignment apparatus 50 is shared between the measuring units 14 in each measuring unit group 15. The alignment apparatus 50 may be shared by all measuring units 14. According to such a configuration, it is possible to reduce the footprint (installation area) of the whole apparatus, and improve processing capability per unit area, and it is possible to attain reduction in cost.

Second Embodiment

Now, a second embodiment will be described. Hereinafter, description of parts that are common with the above embodiments will be omitted, and characteristic parts of this embodiment will be mainly described.

Figure 11A:
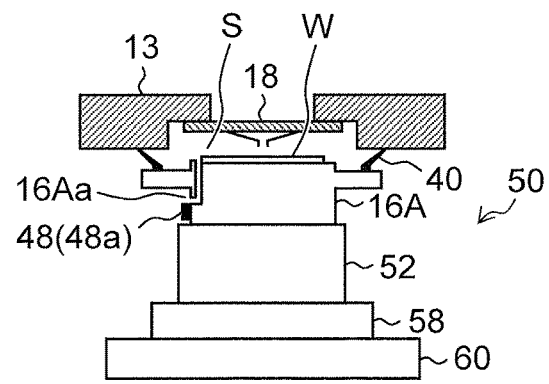
FIGS. 11A to 11C are diagrams illustrating an example of the inspection operation including a probe contact method using a prober according to a second embodiment.
Figure 11B:
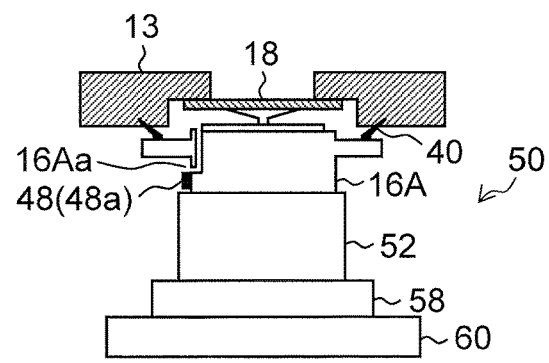
Figure 11C:
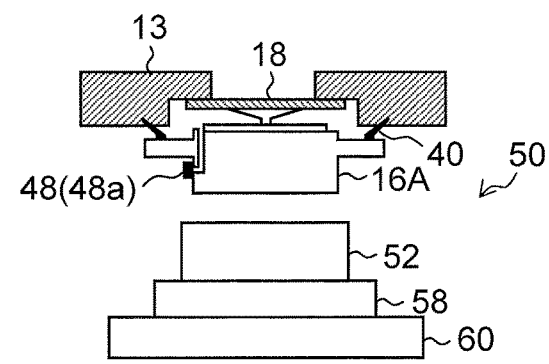

FIGS. 11A to 11C are diagrams illustrating an example of inspection operation including a probe contact method using a prober 10 according to the second embodiment.

In the second embodiment, a wafer chuck has a different configuration from the wafer chuck 16 according to the above first embodiment. That is, a wafer chuck 16A according to the second embodiment is equivalent to a wafer chuck obtained by providing the wafer chuck 16 illustrated in FIG. 10A to FIG. 10E with a communication hole 16Aa (an example of a communication path) that communicates the internal space S to external environment and is opened and closed by shutter unit (shutter) 48. The communication hole 16Aa is provided inside the wafer chuck 16A, and passes through a region near outer periphery on which wafer W is to be placed in an upper surface of the wafer chuck 16A, and a side surface of the wafer chuck 16A.

As illustrated in FIG. 11C, when the communication hole 16Aa is closed by the shutter unit 48, the internal space S becomes a sealed space. On the other hand, as illustrated in FIG. 11A, when the communication hole 16Aa is opened by the shutter unit 48, the internal space S becomes an unsealed space.

The shutter unit 48 is means for opening and closing the communication hole 16Aa which communicates the internal space S with the external environment to make the internal space S to be the sealed space or the unsealed space. The shutter unit includes, for example, a shutter body 48a, and shutter controller (not illustrated) which controls shutter body 48a to move to a position (refer to FIG. 11A) where the communication hole 16Aa is opened, or a position (refer to FIG. 11C) where the communication hole 16Aa is closed. As the shutter controller, a known component such as a motor connected to the shutter body 48a and a controller that controls the motor (both not illustrated) can be used. Places where the communication hole 16Aa and the shutter unit 48 are provided are not limited to the wafer chuck 16A. The communication hole 16Aa and the shutter unit 48 may be provided in a head stage 13 or a probe card 18.

Now, the inspection operation including the probe contact method using the prober 10 according to the second embodiment will be described.

The inspection operation using the prober 10 according to the second embodiment is basically similar to the inspection operation using the prober 10 according to the first embodiment, but the following points are different.

That is, the different point is that in the respective contact steps of performing first contact and second contact, the communication hole 16Aa is opened by the shutter unit 48 from time when at least a ring-shaped seal member 40 is brought into contact with the head stage 13 (or probe card 18) (refer to FIG. 11A) till time when electrode pads on a wafer W and probes 28 are brought into contact with each other (refer to FIG. 11B) so that the internal space S is brought into the unsealed state.

For example, until the respective contact steps of performing the first contact and the second contact are completed, and the fixing between the wafer chuck 16A and an alignment apparatus 50 (Z-axis moving and rotating unit 52) (for example, fixing by vacuum suction) is released, the communication hole 16Aa is opened and the internal space S is in the unsealed state.

Then, as illustrated in the FIG. 11C, at timing when the fixing between the wafer chuck 16A and the alignment apparatus 50 (Z-axis moving and rotating unit 52) (for example, fixing by vacuum suction) is released, the communication hole 16Aa is closed, the internal space S is brought into a sealed state, and the internal space S is depressurized in a depressurizing step. Other operation is similar to the operation according to the first embodiment.

In the first embodiment, because the internal space S is in a sealed state in the respective contact steps of performing the first contact and the second contact, there is a possibility that the sealed space (internal air) is compressed at the time of each contact, and reaction force by this compression becomes load in lift up of the wafer chuck 16A so that the lift up speed of the electrode pads on the wafer W with respect to the probes 28 is reduced. As a result, there is a risk that the oxide films as the insulators formed on the electrode pads cannot be sufficiently scraped (broken).

On the other hand, according to the second embodiment, in the respective contact steps of performing the first contact and the second contact, the internal space S is in the unsealed state, and therefore reaction force due to compression resulting from the sealed space (internal air) compressed at the time of each contact is prevented from becoming load in lift-up of the wafer chuck 16, and the lift up speed of the electrode pads on the wafer W to the probes 28 is prevented from reducing. As a result, it can be expected that the oxide films as the insulators formed on the electrode pads are sufficiently scraped (broken).

Here, in the second embodiment, similarly to the first embodiment, a mode in which fixing between the wafer chuck 16 and the alignment apparatus 50 (Z-axis moving and rotating unit 52) is released at timing (second timing) later than timing (first timing) of starting depressurization of the internal space S can be preferably employed. Additionally, a mode in which a throttle valve that controls a flow rate of gas is provided in a suction route for sucking the wafer chuck 16 to fix the wafer chuck 16 to the alignment apparatus 50 (Z-axis moving and rotating unit 52) is more preferable.

Third Embodiment

Now, a third embodiment will be described. Hereinafter, description of parts that are common with the above embodiments will be omitted, and characteristic parts of this embodiment will be mainly described.

In the first embodiment, after the final contact step (for example, the second contact) is performed, the depressurizing step of depressurizing the sealed internal space S surrounded by the wafer chuck 16, the probe card 18 and the ring-shaped seal member 40 is performed to draw the wafer chuck 16 toward the probe card 18. At this time, movement of the wafer chuck 16 in the horizontal direction (X and Y directions) is regulated only by contact pressure between the electrode pads on the wafer W and the probes 28 (that is, stylus pressure of the probe card 18). Therefore, when disturbance such as vibration is received from the outside at the time of performing the depressurizing step, horizontal positional deviation or inclination is likely to occur in the wafer chuck 16, and there is a possibility that the wafer chuck 16 does not lift up straight in vertically direction (Z direction).

In the third embodiment, the following configuration is provided in order to improve movement stability of a wafer chuck 16 in a depressurizing step.

Figure 13:
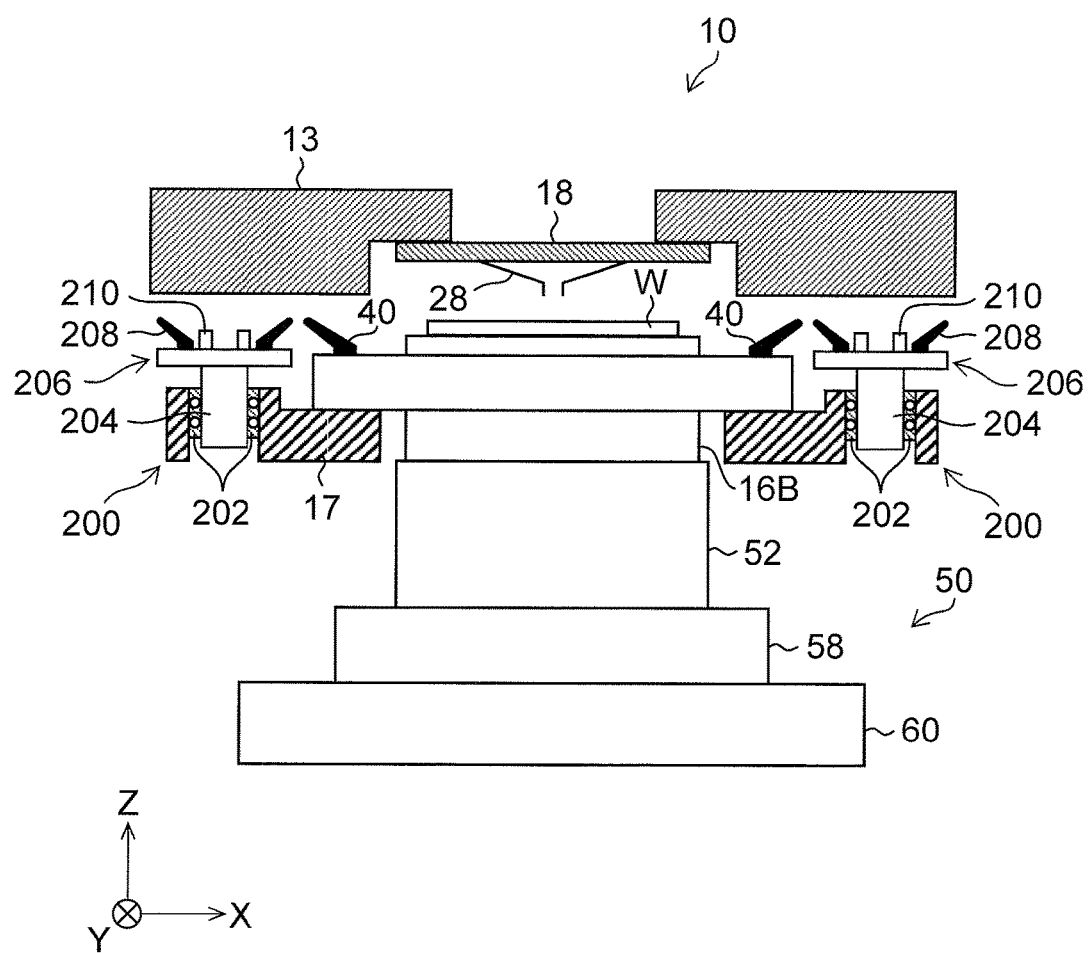
FIG. 13 is a schematic view illustrating a configuration of a prober according to a third embodiment.

FIG. 13 is a schematic view illustrating a configuration of a prober 10 according to the third embodiment.

As illustrated in FIG. 13, the prober 10 according to the third embodiment includes chuck guide mechanisms 200 that guide a wafer chuck 16B in the Z direction (vertically direction) as a configuration for preventing positional deviation or inclination of the wafer chuck 16B in the X and Y directions (horizontal direction) when the wafer chuck 16B is drawn toward a probe card 18 by depressurization of an internal space S (refer to FIGS. 14A to 14F). The chuck guide mechanisms 200 each is example of guide means.

A plurality of the chuck guide mechanisms 200 are provided in parallel in peripheral edge of the wafer chuck 16B along the circumferential direction, specifically, in an outer peripheral portion of a chuck guide holding part 17 integrated with the wafer chuck 16B. The chuck guide mechanisms 200 suck and fix a chuck guide 204 (described below) to a head stage 13 by vacuum suction or the like, before operation of drawing the wafer chuck 16B toward the probe card 18 by depressurization of the internal space S. The chuck guide mechanisms 200 each function as a guide mechanism that moves the wafer chuck 16B in the direction parallel to the Z direction while regulating movement of the wafer chuck 16B in the horizontal direction. Therefore, the wafer chuck 16B (chuck guide holding part 17) is provided with at least three chuck guide mechanisms 200 at positions different from each other in the horizontal direction (X and Y directions) orthogonal to the movement direction of the wafer chuck 16B (Z direction). In this example, although illustration is omitted, the chuck guide holding part 17 is provided with four chuck guide mechanisms 200 along the circumferential direction at equal intervals (each 90 degrees) (only the two chuck guide mechanisms are illustrated in FIG. 13).

Herein, a configuration of each chuck guide mechanism 200 will be described in detail.

The chuck guide mechanisms 200 each have a bearing 202 formed in a chuck guide holding part 17, and a chuck guide (guide shaft) 204 that is movable in the Z direction (vertically direction) in a state where movement in the X and Y directions (horizontal direction) is regulated by the bearing 202. The bearing 202 is composed of, for example, a ball bearing.

The chuck guide 204 is rotatably and pivotally supported by the bearing 202, and has an upper portion provided with a fixing part 206 that detachably fixes the chuck guides 204 to the head stage 13. A ring-shaped seal member (hereinafter referred to as a "chuck guide seal rubber) 208 is provided on an upper surface of the fixing part 206. In addition, a suction port (not illustrated) connected to suction means (not illustrated), and a clearance retaining member 210 which keeps a constant distance (clearance) between the fixing part 206 and the head stage 13 are provided inside the chuck guide seal rubber 208. The shape of the clearance retaining member 210 is not particularly limited, as long as the clearance retaining member 210 can keep a constant clearance between the fixing part 206 and the head stage 13.

Now, inspection operation including a probe contact method using the prober 10 according to the third embodiment will be described with reference to FIGS. 14A to 14F. FIGS. 14A to 14F are diagrams illustrating an example of the inspection operation including the probe contact method using the prober 10 according to the third embodiment.

First, similarly to the first embodiment, the wafer chuck 16B is lifted up and down along the Z direction by a Z-axis moving and rotating unit 52 to perform a plurality of times of contact steps (for example, the first contact and second contact) (refer to FIG. 14A to FIG. 14D). It is assumed that after the final contact step (for example, the second contact) is performed, the chuck guide seal rubbers 208 are in contact with the head stage 13.

Figure 14A:
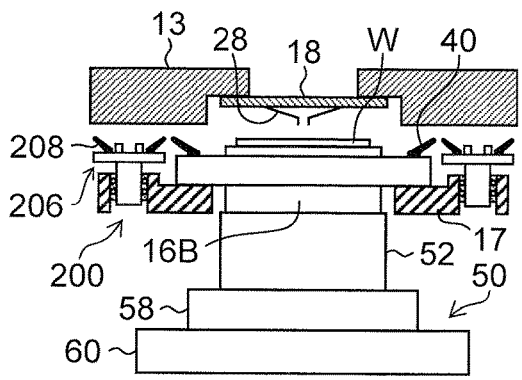
FIGS. 14A to 14F are diagrams illustrating an example of inspection operation including a probe contact method using the prober according to the third embodiment.
Figure 14D:
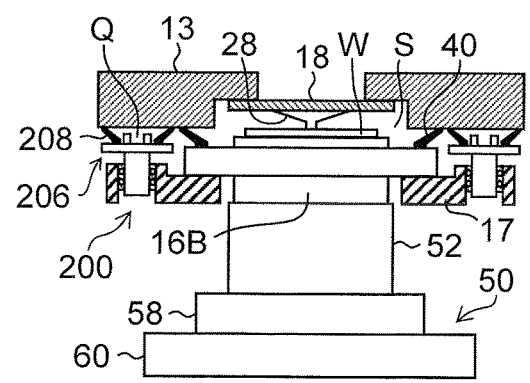
Figure 14B:
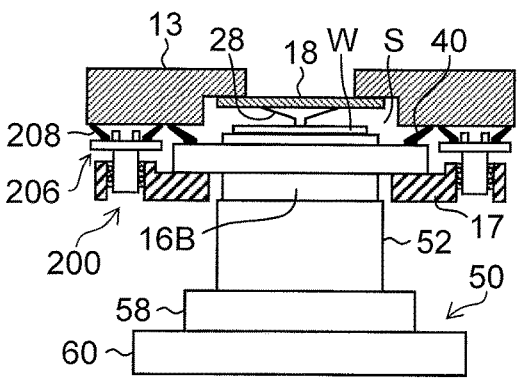
Figure 14E:
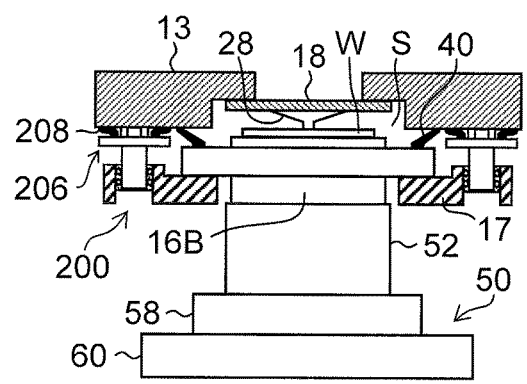
Figure 14C:
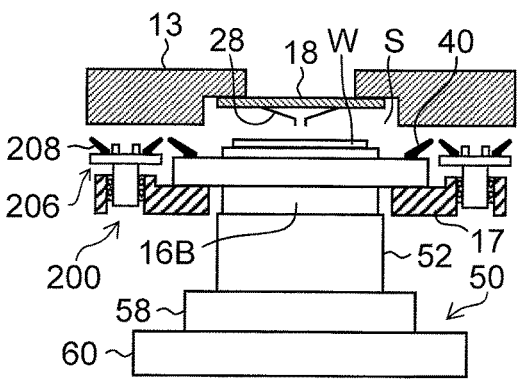
Figure 14F:
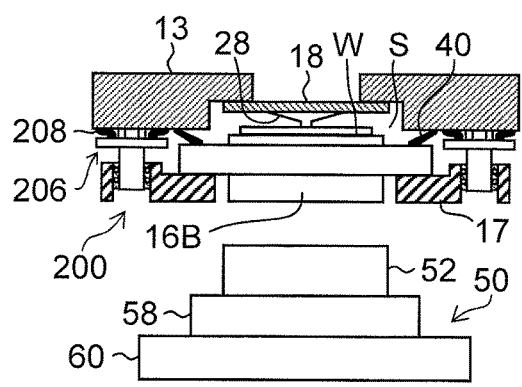

Then, when an internal space Q formed between the chuck guide seal rubber 208, the head stage 13 and the fixing part 206 is depressurized by the suction means (not illustrated), the chuck guides 204 lift up toward the upper side (head stage 13 side), the fixing part 206 of the chuck guides 204 is suctioned and fixed to the head stage 13 (refer to FIG. 14E). At this time, a constant clearance is secured between the head stage 13 and the fixing part 206 by the above clearance retaining member 210, and therefore excessive suction by the fixing part 206 of the chuck guides 204 is suppressed, and it is possible to prevent inclination of each chuck guide 204 fixed to the head stage 13. Then, when the wafer chuck 16B is drawn toward the probe card 18 by depressurization of the internal space S, the wafer chuck 16B is guided and moved in the Z direction while movement of the wafer chuck 16B in the X and Y directions is regulated by the chuck guides 204 fixed to the head stage 13 (refer to FIG. 14F).

Thus, according to the third embodiment, the prober 10 includes the chuck guide mechanisms 200 that guide the wafer chuck 16B along the chuck guides 204 in the Z direction in a state where the chuck guides 204 (fixing parts 206) are sucked and fixed to the head stage 13 by vacuum suction or the like. Thus, when the wafer chuck 16B is drawn toward the probe card 18 by depressurization of the internal space S, it is possible to prevent positional deviation and inclination of the wafer chuck 16B. Therefore, it is possible to prevent inclination and the positional deviation due to unbalanced load caused by a component of the wafer chuck 16B, and delivery operation of the wafer chuck 16B can be stably performed in a state where parallelism of the probe card 18 and the wafer W is kept, and it is possible to implement excellent contact between the electrode pads on the wafer W and the probes 28.

In the third embodiment, as a fixing system used in the chuck guide mechanisms 200, a suction type such as vacuum suction is employed. However, as long as the chuck guides 204 can be detachably fixed to the head stage 13, various known types can be employed. A mechanical type such as a clamp may be employed.

In the third embodiment, the chuck guide mechanisms 200 are provided on the wafer chuck 16B side, and the chuck guides 204 (fixing parts 206) are sucked on the head stage 13 side. However, the chuck guide mechanisms 200 may be provided on the head stage 13 side, and the chuck guides 204 (fixing parts 206) may be sucked on the wafer chuck 16B side.

While the prober and the probe contact method of the present invention are described in detail as described above, the present invention is not limited to the above embodiments, and it goes without saying that various improvements or modifications may be performed without departing from the scope of the present invention.

REFERENCE SIGNS LIST 10 prober
11 base
12 side plate
13 head stage
14, 14A, 14B, 14C measuring unit
15 measuring unit group
15A, 15B, 15C measuring unit group
16, 16A, 16B wafer chuck
16Aa communication hole
17 chuck guide holding part
18 probe card
20 tester
22, 22A, 22B, 22C test head
24 contact ring
26 mounting hole
28 probe
30 holding part
32 passing hole
40 ring-shaped seal member
42 suction port
43 suction path
44 vacuum pump
46 suction controller
48 shutter unit
48a shutter body
50 alignment apparatus
52 Z-axis moving and rotating unit
54 probe position detecting camera
56 camera moving mechanism
58 X-axis moving table
60 Y-axis moving table
62 base
64 strut
66 alignment camera
68 guide rail
70 ball screw
72 guide rail
74 ball screw
100 moving apparatus
101 guide rail
102 conveying pallet
106 lifting mechanism
108 driving unit
110 timing belt
112 drive motor
114 drive pulley
116 idle pulley
118 drive motor
120 ball screw
130, 130A, 130B, 130C positioning pin
134, 134A, 134B, 134C chuck member
200 chuck guide mechanism
202 bearing
204 chuck guide
206 fixing part
208 chuck guide seal rubber
210 clearance retaining member
Q, S internal space
W wafer

What is claimed is:

1. A prober comprising:
a wafer chuck configured to hold a wafer;
a probe card provided facing the wafer chuck and including probes at positions corresponding to respective electrode pads on the wafer;
a seal member having an annular shape, the seal member provided in the wafer chuck and formed to surround the wafer held by the wafer chuck;
a mechanical lift configured to detachably support the wafer chuck and capable of vertically move the wafer chuck, the mechanical lift configured to move the wafer chuck toward the probe card until the probes are brought into contact with the electrode pads;
a decompressor configured to depressurize an internal space formed by the probe card, the wafer chuck and the seal member, when the wafer chuck is moved toward the probe card by the mechanical lift; and
at least three guides that are provided on the wafer chuck, the guides configured to guide movement of the wafer chuck when the wafer chuck is drawn to move toward the probe card by depressurization of the internal space, while regulating the movement of the wafer chuck in a direction orthogonal to a direction of the movement of the wafer chuck toward the probe card, wherein the at least three guides are provided at positions different from each other in the direction orthogonal to the direction of the movement of the wafer chuck.

2. The prober according to claim 1, wherein the guide comprises:

a bearing provided in the wafer chuck; and a guide shaft pivotally supported by the bearing and detachably fixed to a probe card supporting member.

3. The prober according to claim 1, further comprising a shutter provided separately from the seal member, and capable of switching a communication state between the internal space and an outer space, wherein the shutter connects the internal space with the outer space when the wafer chuck is moved toward the probe card by the mechanical lift, and the shutter shuts off connection between the internal space and the outer space when the decompressor depressurizes the internal space.

4. The prober according to claim 3, wherein the shutter is provided in the wafer chuck.

5. The prober according to claim 1, wherein the mechanical lift moves the wafer chuck toward the probe card until the probes and the electrode pads are brought into contact with each other with an overdrive applied to the probes.

6. The prober according to claim 1, wherein the mechanical lift releases fixation of the wafer chuck when the depressurization of the inner space begins.

7. The prober according to claim 1, wherein each of the probes is a cantilever type probe.

* * * * *